United States Patent [19]
Takahashi

[11] Patent Number: 6,051,304
[45] Date of Patent: Apr. 18, 2000

[54] MAGNETORESISTANCE ELEMENT AND ITS MANUFACTURE

[76] Inventor: Migaku Takahashi, 20-2, Hitokida 2-chome, Taihaku-ku, Sendai-shi, Miyagi-ken, 982-02, Japan

[21] Appl. No.: 09/000,155

[22] PCT Filed: Jul. 26, 1996

[86] PCT No.: PCT/JP96/02120

§ 371 Date: Apr. 23, 1998

§ 102(e) Date: Apr. 23, 1998

[87] PCT Pub. No.: WO97/05664

PCT Pub. Date: Feb. 13, 1997

[30]    Foreign Application Priority Data

Jul. 28, 1995    [JP]    Japan ................................. 7-193882

[51] Int. Cl.[7] ....................................................... G11B 5/66
[52] U.S. Cl. ..................... 428/141; 428/692; 428/634 R; 428/634 T; 428/634 TS; 428/634 TM; 428/634 TR; 428/30; 204/192.2; 204/192.32; 204/192.37
[58] Field of Search ................................ 428/632, 634 R, 428/634 T, 634 TS, 634 TM, 634 TR, 900, 141; 204/192.2, 192.32, 192.37

[56]    References Cited

FOREIGN PATENT DOCUMENTS

| | | |
|---|---|---|
| 63-142689 | 6/1988 | Japan . |
| 5-114761 | 5/1993 | Japan . |
| 5-140738 | 6/1993 | Japan . |
| 06310329 | 11/1994 | Japan . |
| 06325934 | 11/1994 | Japan . |
| 07057933 | 3/1995 | Japan . |
| 07066036 | 3/1995 | Japan . |
| 07129928 | 5/1995 | Japan . |
| 07321386 | 12/1995 | Japan . |

*Primary Examiner*—Leszek Kiliman
*Attorney, Agent, or Firm*—Randall J. Knuth

[57]    ABSTRACT

A magnetoresistance element for reproducing magnetic signals with higher sensitivity and its manufacturing method. The magnetoresistance element has a structure including alternate layers of ferromagnetic material and nonmagnetic material on a substrate, and the oxygen concentration in the structure is less than 100 wt. ppm. Alternatively, the magnetoresistance element comprises a substrate, a nonmagnetic layer on the substrate, a ferromagnetic layer on the nonmagnetic layer on the substrate, a ferromagnetic layer on the nonmagnetic layer, and an antiferromagnetic layer on the ferromagnetic layer, and the oxygen concentration in the part where the ferromagnetic material layers are laminated with the nonmagnetic material layers in between is less than 100 wt. ppm.

14 Claims, 23 Drawing Sheets

MAGNETORESISTANCE ELEMENT AND ITS MANUFACTURE

BACKGROUND OF THE INVENTION

1. Field of the Invention

The present invention relates to a magnetoresistance element and a manufacturing method therefor. In greater detail, the present invention relates to a magnetoresistance element having a large magnetoresistance (MR) rate of change, as well as to a manufacturing method for this element. The magnetoresistance element of the present invention is optimally applied to heads which reproduce magnetic signals written onto hard disks, floppy disks, magnetic tape, and the like.

2. Description of the Related Art

With respect to conventional magnetoresistance elements and manufacturing methods for such elements, the following technologies have all been reported by Inomata (Kouichiro Inomata: Ouyou Butsuri (applied physics), 63, 1198 (1194)).

FIGS. 5(b) and 6(b) are schematic diagrams showing the cross-sectional structure of conventional magnetoresistance elements. FIG. 5(b) shows an artificial lattice type structure (A) comprising a structure in which, on the surface of a substrate 501, there are a plurality of layers in which a nonmagnetic layer (spacer) 522 is sandwiched between ferromagnetic layers 521. Furthermore, FIG. 6(b) shows a spin valve type (B) having a structure in which, on the surface of a substrate 601, two ferromagnetic layers 621 are laminated with a nonmagnetic layer 622 therebetween, and an antiferromagnetic layer 623 is formed on the surface of the ferromagnetic layer which was provided last.

An example of the (A) artificial lattice type is a structure in which the nonmagnetic layer is formed from a Cr film, and the ferromagnetic layers are formed by Fe; that is to say, a Fe/Cr structure (FIG. 14, M. N. Baibich. et al.: Phys. Rev. Lett. 61, 2472 (1988)). FIG. 14 is a graph showing the change in resistance observed in three types of structures when an external magnetic field was altered. The vertical axis represents a standardization against the value observed in a magnetic field of 0. In the case of Fe/Cr, when the external magnetic field is at 0, the spin of the Fe layers is coupled in a mutually anti-parallel fashion and the resistance is high; it is noted that when a sufficiently large magnetic field (a saturation magnetic field, $H_s$) is applied, the spin becomes mutually parallel and the resistance drops. The MR ratio at this time (the ratio of the change in resistance with respect to the resistance value in a saturation magnetic field) is 4.2 K and thus roughly 85%; even at room temperature, this is very large, at approximately 20%.

However, there is a problem in that although the Fe/Cr structure has a large MR ratio, $H_s$ is also large, at approximately $1.6 \times 10^6$ A/m (20 kOe).

A structure in which the nonmagnetic layer comprises a Cu film and the ferromagnetic layer comprises a Co film, that is to say, a Co/Cu structure, has also been researched (D. H. Mosca. et al.: J. Magn. & Magn. Mater. 94, L1(1991), and S. S. P. Parkin. et al.: Phys. Rev. Lett. 66, 2152 (1991)). The MR ratio of the Co/Cu structure exceeds 50% at room temperature, and the $H_s$ is also smaller than that of the Fe/Cr.

Research was subsequently conducted on a number of artificial lattices; however, aside from the Fe/Cr system, the systems which have chiefly attracted attention are Co systems and Ni systems in which a noble metal is used as the spacer. Representative examples of these include, for example, Co/Cu, Co—Fe/Cu, Ni—Fe/Cu, Ni—Fe/Ag, and Ni—Fe—Co/Cu. Co systems exhibit a large MR ratio, while Ni systems exhibit a small saturation magnetic field. Fe/Cr systems have a spacer which is a transition metal, and have been studied in comparison with noble metal spacers in order to understand the mechanism thereof.

However, in considering magnetic head uses, it is desirable that $H_s$ be a few hundred Oe, and that a large MR ratio (at room temperature) be present; and there has been a problem in that in each of the systems described above, the confirmed MR ratio is insufficient.

One indication with respect to this problem is the report by the group of the present inventors that an MR ratio of approximately 6–7% was obtained in a Co/Cu system (Tsunoda, Takahashi, Miyazaki: Nihon Ouyou Jikigaku Kaishi Butsuri, 17, 826 (1993)). In this report, it was noted that it was possible to realize a MR ratio (at room temperature) of approximately 6.5% and a $H_s$ of approximately 0.2 kOe in a layered structure formed by the DC magnetron sputtering method, comprising a glass substrate and Cu (10 nm) [Cu(2.1 nm) Co(2.0 nm)] 20 Cu(10 nm). Furthermore, the MR ratio was found to be dependent on the Cu film thickness and the gas pressure. Additionally, waviness having a period of 10 nm to 50 nm was present in the surface of the laminated structure, and as the MR ratio decreased, the waviness of the structure increased, so that it is noted that in order to achieve a large MR ratio, it is a necessary condition that the structure be made flat.

Accordingly, the problem remains of determining film material and film formation conditions of each layer in order to make the structure flat.

Furthermore, Fullerton, et al. (E. E. Fullerton. et al.: Phys. Rev. Lett. 68, 859 (1992)), and Takanashi et al. (K. Takanashi et al.: J. Phys. Soc. Jpn. 61, 1169 (1992)) have reported mutually conflicting results with respect to turbulence at the interface between the nonmagnetic layer and the magnetic layer. Fullerton et al. have reported that the MR ratio increases when the turbulence at the interface is large. However, Takanashi et al. maintain that the MR ratio increases when the turbulence at the interface is small.

However, in the general report of Inomata it is noted that these two claims are not inconsistent and can be unified: "if scattering which is not dependent on spin is made as small as possible, and only that interface which contributes to spin dependent scattering is increased, MR will increase." Accordingly, in general terms, it has been discovered that the interface should be made flat.

Additionally, Inomata et al. have investigated the relationship between the degree of turbulence of the atoms at the interface and the MR ratio using NMR (nuclear magnetic resonance). In the film formation, the ion beam sputtering method was employed, and the acceleration voltage (VB) of the sputtered Ar ions was altered, and a Co/Cu superlattice was produced on a MgO (110) substrate. As a result, it was reported that in the test material exhibiting the greatest MR ratio, where VB=600 V, the interface mixing layer is a monatomic layer with respect to Co and Cu, respectively, and the component ratio of Co and Cu in the mixing layer is approximately 7 to 3 (K. Inomata et al.: J. Phys. Soc. Jpn. 62, 1450 (1993)). Accordingly, when the interface is microscopically apprehended, at the 1–2 atomic level, it is presumed that the presence of an appropriate mixing layer has the effect of increasing the MR ratio.

The (B) spin valve type represents a method for obtaining a large MR in a weak magnetic field. With respect to these types of methods, the fact that the methods shown below have been proposed by various institutions is reported in the general report of Inomata described above.

(1) A method in which the thickness of the nonmagnetic layer (spacer) is increased, the magnetic bonding between the magnetic layers is weakened, two types of magnetic layers having differing coercive forces (for example, Co and permalloy) are used, and only reversal of magnetization of the magnetic layer having the smaller coercive force is employed (T. Shinjo et al.: J. Phys. Soc. Jpn. 59, 3061 (1990)).

(2) A method in which anisotropy along one axis is provided at the surface of the film, which employs the sudden reversal of magnetization along the easy axis of magnetization (K. Inomata et al.: Appl. Phys. Lett. 61, 726 (1992)).

(3) A method in which an antiferromagnetic FeMn is employed, such as FeMn/NiFe/Cu/NiFe, the magnetization of the magnetic layers in contact with this is fixed, and only the reversal of magnetization of the other magnetic layers is employed (a non-bonding type spin valve film) (B. Dieny et al. Phys. Rev. B43, 1297 (1992)).

(4) A method which employs a multi-layered film of NiFeCo alloy, which is crystalline and magnetically anisotropic and is a weak magnetic material with little magnetic distortion, and Cu (J. Mouchot et al.: IEEE Trans. Mag. 29, 2732 (1993)).

(5) A method in which NiFe/Ag is subjected to heat treatment, and the NiFe layer is divided using the dispersion of Ag along the crystal granule interfaces of the NiFe (a non-continuous multi-layered film, or a granular multi-layered film) (T. L. Hylton et al.: Science 261, 1021 (1993)).

(1) through (4) above can be made to reflect the same understanding of the artificial lattice described above, that is to say, the ideas relating to the flatness of each layer and the turbulence at the interface. Only in the case of (5) above need a different mechanism be considered; it seems that here that a high MR ratio can not be considered.

As described above, research and development has progressed in each institution towards obtaining a high MR ratio. However, in the present state of affairs, in which higher and higher recording densities are achieved, the realization of a magnetoresistance element which is capable of conducting the reproduction of magnetic signals with high sensitivity, that is to say, the development of a magnetoresistance element having a MR ratio (at room temperature) which is higher than that conventionally obtained has been strongly desired. Furthermore, there has also been a desire for the development of a method which can stably produce such elements.

The present invention has as an object thereof to provide a magnetoresistance element which is capable of reproducing magnetic signals with high sensitivity, as well as a manufacturing method for such elements.

SUMMARY OF THE INVENTION

The magnetoresistance element of the present invention comprises a magnetoresistance element having a structure in which a plurality of ferromagnetic layers, sandwiched between nonmagnetic layers, are laminated on the surface of the substrate, wherein the oxygen concentration within the nonmagnetic layers and the ferromagnetic layers is less than or equal to 100 wt. ppm.

Furthermore, the magnetoresistance element of the present invention comprises a magnetoresistance element having a structure wherein a ferromagnetic layer sandwiched between nonmagnetic layers is laminated on the surface of a substrate, and an antiferromagnetic layer is formed on the surface of the ferromagnetic layer which was provided last, wherein, within this structure, the oxygen concentration contained in the parts, in which ferromagnetic layers are laminated so as to sandwich the nonmagnetic layer, is less than or equal to 100 wt. ppm.

In the manufacturing method for magnetoresistance elements of the present invention, after the back pressure within the film formation chamber has been set to $10^{-9}$ Torr or less, using Ar having an impurity concentration of 10 ppb or less as the gas for film formation, the nonmagnetic layers, ferromagnetic layers, and antiferromagnetic layers are formed by means of the sputtering method.

Function

In the magnetoresistance element of the present invention, in a magnetoresistance element having a structure in which a plurality of ferromagnetic layers sandwiching nonmagnetic layers are laminated on the surface of a substrate, the oxygen concentration of the nonmagnetic layers and the ferromagnetic layers is set to 100 wt. ppm. or less, and thereby, there are few granules which grow in a crystalline manner around such impurities, so that it is possible to make uniform the surface density of the granules which initially grow on the surface of the substrate. As a result, it is possible to increase the flatness of each layer and to reduce the turbulence at the interface between the nonmagnetic layers and the magnetic layers. Accordingly, it is possible to realize a magnetoresistance element having a large MR ratio.

Furthermore, in the magnetoresistance element of the present invention, in a magnetoresistance element comprising a structure in which ferromagnetic layers sandwiching a nonmagnetic layer are laminated on the surface of a substrate, and an antiferromagnetic layer is formed on the surface of the ferromagnetic layer which is provided last, within this structure, the oxygen concentration contained in the part at which the ferromagnetic layers sandwiching the nonmagnetic layer are laminated is set to 100 wt. ppm. or less, and thereby, there are few granules which grow in a crystalline manner around impurities, so that it is possible to make uniform the surface density of the granules which grow initially at the surface of the substrate. As a result, it is possible to increase the flatness of each layer, and it is possible to reduce the turbulence at the interface between the nonmagnetic layer and the magnetic layers. Accordingly, it is possible to realize a magnetoresistance element having a large MR ratio.

In the manufacturing method for magnetoresistance elements in accordance with the present invention, after the back pressure within the film formation chamber has been set to $10^{-9}$ Torr or less, using Ar having an impurity concentration of 10 ppb or less as the film formation gas, nonmagnetic layers, ferromagnetic layers, and antiferromagnetic layers are formed by a sputtering method, so that the oxygen concentration of each layer is 100 wt. ppm. or less, and it is possible to produce a structure having a high adhesion strength of each layer. As a result, it is possible to increase the flatness of each layer, and to reduce the turbulence at the interface between the nonmagnetic layers and the magnetic layers. Accordingly, it is possible to realize a manufacturing method by means of which magnetoresistance elements having a large MR ratio can be formed in a stable manner.

Hereinbelow, embodiment examples of the present invention will be explained.

Examples of the substrate body include, for example, glass, ceramic, and complexes thereof, as well as such materials which have been subjected to surface coating treatment, in which a nonmagnetic film of a differing material is formed on the surface by means of a sputtering method, a vapor deposition method, a plating method, or the like. Preferable nonmagnetic films provided on the surface of these substrate bodies should not magnetize at high temperatures, should be conductive, and should be easily mechanically worked, but should also possess the appropriate degree of surface hardness to withstand the rubbing and abrasion experienced during head movement. An example of a substrate which meets such conditions, in particular in the case of application as a head, includes an altic (a sintered product of aluminum oxides and titanium carbide) substrate having a nonmagnetic film provided on the surface thereof. Preferable for use as the nonmagnetic film in this case are Cu, Ta, W, Ti, or Cr.

In order to maintain the flatness of the thin film formed on the substrate body, it is necessary to appropriately control the surface roughness and waviness, that is to say, the flatness of the surface of the substrate body. For this reason, at the development level, glass substrates (for example, Corning #7059) which can be stably obtained by optical polishing (so that the surface roughness Ra <0.1 nm, and the surface waviness is 500 nm or more) are widely employed.

Examples of the "structure in which a plurality of ferromagnetic layers sandwiching nonmagnetic layers are laminated", that is to say, artificial lattices, of the present invention include, for example, written as (ferromagnetic layer)/(nonmagnetic layer), Co/Cu, Co—Fe/Cu, Ni—Fe/Cu, Ni—Fe/Ag, Ni—Fe—Co/Cu, and Fe/Cr.

When a Co system is employed as the ferromagnetic layer, it is easy to obtain a large MR ratio, while when a Ni system is employed, it is easy to obtain a small saturation magnetic field. Fe/Cr has been studied as a contrast to the noble metal spacers in order to understand the mechanism thereof, since the spacer is a transition metal. Among these, a Co system is preferably employed, since it facilitates obtaining the high MR ratio which is the object of the present invention.

The thicknesses of the nonmagnetic layer and the ferromagnetic layers are appropriately determined in order to reduce the saturation magnetic field while maintaining a high MR ratio. A film thickness within a range of 0.5 nm to 5 nm is preferable for the nonmagnetic layer, while a range of 0.5 nm to 5 nm is preferable for the ferromagnetic layer.

The number of ferromagnetic layers sandwiching nonmagnetic layers which are laminated which is capable of application is 50 or less. When a greater number of layers is laminated, the waviness of the structure increases, and the MR ratio declines sharply.

Examples of the "structure in which ferromagnetic layers sandwiching a nonmagnetic layer are laminated, and an antiferromagnetic layer is formed on the surface of the ferromagnetic layer which is provided last", that is to say, the spin valve type, of the present invention include, for example, written as (antiferromagnetic layer)/(ferromagnetic layer)/(nonmagnetic layer)/(ferromagnetic layer), FeMn/NiFe/Cu/NiFe, FeMn/NiFe/Ag/NiFe, FeMn/Co/Cu/NiFe, FeMn/CoNiFe/Cu/NiFe, NiO/NiFe/Cu/NiFe, and NiO/Co/Cu/NiFe.

This spin valve type is presently attracting a great deal of attention as it allows a MR ratio of approximately 4% to be obtained in a small magnetic field of approximately 80 A/m (1 Oe), and as there is no magnetic bonding between layers, since the nonmagnetic layer (the spacer) is thick, MR curves having little hysteresis can be obtained.

The thickness of the nonmagnetic layer and the ferromagnetic layers is appropriately determined so as to reduce the saturation magnetic field while maintaining a high MR ratio. The film thickness of the nonmagnetic layer is preferably within a range of 0.5 nm to 5 nm, while the film thickness of the ferromagnetic layers is preferably within a range of 0.5 nm to 5 nm, and the thickness of the antiferromagnetic layer is preferably within a range of 1 nm to 100 nm.

In the present invention, the "oxygen concentration in the nonmagnetic layer and the ferromagnetic layers" is preferably 100 wt. ppm. or less. By limiting the oxygen concentration to this range, it is possible to keep the surface roughness Ra of each layer to a level of 0.2 nm or less, and it is also possible to set the surface waviness of each layer to 50 nm or more. At the outermost surface of a structure in which layers in which this is reflected are laminated, a Ra of 0.5 nm or less and a waviness period of 30 nm or more can be simultaneously obtained. As a result, it is possible to limit the turbulence at the laminate interfaces in the structure. Accordingly, a MR ratio can be realized which is higher than that which was conventionally obtainable.

What is meant by the sputtering method of the present invention described above is film formation under conditions in which the attained vacuum degree within the film formation chamber used for the formation of the nonmagnetic layer, ferromagnetic layers, and the antiferromagnetic layer is $10^{-9}$ Torr, and the impurity concentration in the Ar gas used during the formation of the nonmagnetic layer, the ferromagnetic layers, and antiferromagnetic layer is 10 ppb or less.

On the other hand, the "oxygen concentration in the nonmagnetic layer and the ferromagnetic layers" when these layers were produced by a conventional sputtering method was known to be 250 wt. ppm. or more. However, there has been no clear report with respect to the effects which the oxygen concentration in each layer exerts on the flatness of each layer, that is to say, of the effect with respect to the surface roughness and waviness of each layer. Furthermore, since there has also been no report of investigations into the relation between the oxygen concentration and the MR ratio, there has been a need for thorough investigations in this area.

What is meant by the conventional sputtering method described above is film formation under conditions such that the attained vacuum degree of the film formation chamber in which the nonmagnetic layer, the ferromagnetic layers, and the antiferromagnetic layer were formed was approximately $10^{-7}$ Torr, and the impurity concentration of the Ar gas used during the formation of the nonmagnetic layer, the ferromagnetic layers, and the antiferromagnetic layer was 1 ppm or more.

Two types of sputtering methods are employed in the present invention: (1) an opposed target type DC sputtering method, and (2) a DC magnetron sputtering method. In the embodiments of the present invention, method (1) was employed in the case of artificial lattice types, while method (2) was employed in the case of spin valve types. However, insofar as the oxygen concentration in each layer is kept at a level of 100 wt. ppm. or less, any sputtering method may employed.

FIG. 5 is a structural diagram explaining the film formation method (1) described above. FIG. 5(*a*) is a cross-sectional view showing the film formation device, while FIG. 5(*b*) is a cross-sectional view showing the sample produced.

In FIG. 5(*a*), reference 500 indicates a vacuum chamber, the inner walls of which have been subjected to compound electropolishing, while reference 501 indicates a substrate comprising glass. Substrate body 501 is attached to a substrate body support platform 502 which is capable of rotation in the direction of the arrows. References 503–506 indicate cathodes; cathodes 503 and 504 (cathodes 505 and 506) are disposed so as to be facing one another. Additionally, Cu target 507 and 508 are installed at cathodes 503 and 504, while NiFe targets 509 and 510 are installed at cathodes 505 and 506.

Substrate body 501 and each cathode are spatially separated by deposition prevention plates 511 and shutters 512 and 513. For example, by moving 501 to a position (A) parallel to a vertical line connecting the centers of the surfaces of the mutually opposed targets (507 and 508), and by opening and closing shutter 512, a Cu film is formed on the surface body of the substrate. The thickness of the film formed is controlled by altering the amount of time shutter 512 is open, or the power applied to the cathodes 503 and 504.

The formation of the multi-layered film shown in FIG. (5) is conducted by rotating the substrate body support platform 502 in the direction of the arrows, and repeatedly altering the position of the substrate body 501 in the order A→B→A. In FIG. 5(*b*), reference 501 indicates a substrate body comprising glass, and ferromagnetic layers (NiFe) 521 are repeatedly laminated on this substrate via nonmagnetic layers (Cu) 522. FIG. 5(*b*) shows the case of a number n of lamination cycles of the nonmagnetic layer 522.

FIG. 6 is a schematic diagram which serves to explain the film formation method (2) described above. FIG. 6(*a*) is a cross-sectional diagram showing the film formation device, while FIG. 6(*b*) is a cross-sectional diagram showing a sample which is produced.

In FIG. 6, reference 600 indicates a vacuum chamber, the inner walls of which have been subjected to compound electropolishing, and reference 601 indicates a substrate body comprising glass. References 602–604 indicate cathodes. Targets comprising, in order, NiFe, Cu, and FeMn are disposed at each cathode. A deposition prevention plate 605 and shutters 606–608 are provided in the space between each cathode and the substrate body 601. For example, by moving the substrate to the space (A) above the NiFe target which is being discharged, and by opening and closing shutter 606, a NiFe film is formed on the surface of the substrate body. The thickness of the thin film which is formed can be controlled by altering the time during which the shutter 606 is open, or the power applied to the cathode 602.

The multi-layered film shown in FIG. 6(*b*) can be formed by rotating the substrate 601 in the direction shown by the arrow and repeatedly moving the position of substrate body 601 in the order A→B→A→C. In FIG. 6(*b*), reference 601 indicates a substrate body comprising glass, on which are repeatedly laminated ferromagnetic layers (NiFe) 621 via nonmagnetic layers (Cu) 622. Furthermore, an antiferromagnetic layer (FeMn) 623 is formed on the surface of the ferromagnetic layer 621 which is finally formed.

The gas used in the film formation of the present invention is highly pure Ar gas. Examples of impurities which are present in this highly pure Ar gas include, for example, $H_2O$, $O_2$, $CO_2$, $H_2$, $N_2$, $C_xH_y$, H, and CO. The impurities which are particularly thought to affect the amount of oxygen which is incorporated in the film are $H_2O$, $O_2$, $CO_2$, O, and CO. Accordingly, the impurity concentration in the present invention is expressed as the sum of the $H_2O$, $O_2$, $CO_2$, O, and CO which are contained in the Ar gas which is employed in film formation.

An example of cleaning processing by means of a high frequency sputtering method is, for example, a method in which an alternating current voltage is applied from a RE (radio frequency, 13.56 MHz) power source to a substrate body which is placed in a space having a gas pressure permitting discharge. The chief feature of this method is that it is applicable even in cases in which the substrate body is non-conductive. In general, the effect of cleaning treatment is to increase the adhesion of the thin film to the substrate body. However, there are numerous unclear points with respect to the effect on the quality of the thin film itself which is formed on the surface of tho substrate body after cleaning.

In the present invention, examples of impurities present in the Cu target used during the formation of the nonmagnetic layer include, for example, Ni, Fe, C, O, and N. It is assumed that the impurity which has a particular effect on the amount of oxygen incorporated into the film is O. Accordingly, the impurity concentration in the present invention is expressed as the oxygen which is contained in the Co target used during the formation of the nonmagnetic layer. In the embodiments, a target is used which has an amount of contained oxygen of 1 wt. ppm. or less.

In the present invention, a composition comprising Ni and 21.5 wt % of Fe is employed as the "NiFe target used during the formation of the ferromagnetic layers". Examples of impurities present in this target include, for example, Si, Cu, Al, O, and N. It is presumed that the impurity which has particular effects on the amount of oxygen incorporated into the film is O. According, the impurity concentration in the present invention is shown as the oxygen which is contained in the target used during the formation of the ferromagnetic layers. In the embodiments, a target is employed which has an amount of oxygen contained of 90 wt. ppm.

In the present invention, a composition of Fe and 50 wt % of Mn is employed as the "FeMn target used during the formation of the antiferromagnetic layer." Examples of impurities present in this target include, for example, Co, Al, O, and N. It is presumed that the impurity which has a particular effect on the amount of oxygen incorporated into the films is O. Accordingly, this impurity concentration in the present invention is shown as the oxygen contained in the target used during the formation of the antiferromagnetic metallic layer. In the embodiments, a target containing an amount of oxygen of 240 wt. ppm. is employed.

In the present invention, the surface temperature of the substrate is a film formation factor which governs the surface roughness of the thin film, irrespective of the material of each layer. When a ultra thin film of a metal having a low melting point is formed on a glass substrate, it is commonly known that there is a tendency for the film to be formed in islands if the substrate temperature is high. In the present invention, since the object is to form a thin film having a high degree of flatness, the substrate is maintained at approximately 20° C. by conducting water cooling of the reverse side of the substrate during film formation.

An example of compound electropolishing is processing in which, for example, an oxide passivated film having chromium oxide as a product thereof is provided on the inner walls of the vacuum chamber used during the formation of the magnetic films and the like. In this case, it is preferable that the material forming the inner walls of the vacuum chamber be SUS 316 or the like. By means of this treatment, the amount of $O_2$, $H_2O$ and the like released from the inner walls of the vacuum chamber can be reduced, so that it is possible to further reduce the amount of oxygen which is incorporated into the thin films which are produced.

The inner walls of all the vacuum chambers of the two types of sputter apparatuses employed in the present invention were subjected to such treatment.

An example of the surface roughness in the present invention is, for example, the average center line roughness Ra resulting when the surface of the substrate body (or the surface of a thin film) is observed using atomic force microscopy (AFM). The SFA 300 produced by Seiko Denshi Kogyo was used as the measuring device.

Ra was calculated using the following formula, within the range $S=(500 \text{ nm})^2$, from the AFM image obtained after correcting for the inclination of the sample to be measured.

$$Ra = S^{-1} \int |z(x,y)-z_0| dxdy \quad \text{Formula 1}$$

$$z_0 = S^{-1} \int (x,y) dxdy \quad \text{Formula 2}$$

Here, S indicates the surface area of the range employed in the calculations, and $z(x,y)$ indicates the average height of the substrate body (or the surface of the thin film) at the position $(x,y)$.

What is meant by the surface waviness in the present invention is, for example, the undulations having a period of a few tens of nm which were verified when an observation of the surface of the substrate body or the surface thin film was conducted using atomic force microscopy (AFM).

For example, the surface of a glass substrate which has been subjected to optical polishing has a Ra <0.1 nm and a waviness of >100 nm. When a Cu film of 50 nm is provided on this substrate, under the film formation of the present invention (an attained degree of vacuum of approximately $10^{-9}$ Torr, and an impurity concentration in the Ar gas of 10 ppb or less), it is possible to maintain flatness such that Ra <0.5 nm, and waviness >30 nm. On the other hand, under the conventional film formation conditions (where the attained degree of vacuum is approximately $10^{-7}$ Torr and the impurity concentration in the Ar gas is 1 ppm or more), Ra <3 nm, while the waviness >5 nm, so that the decline in flatness is pronounced.

In the present invention, the measurement of the MR ratio is conducted using the measurement system shown in FIG. 7 comprising a direct current four terminal method. The measurement is conducted within a class 1000 clean room (at atmospheric pressure and room temperature). In FIG. 7, reference 701 indicates a MR element which is formed on a glass substrate 700. Four Au electrodes (702–705) are produced on the surface of the MR element 701 by a sputtering method. The outer electrodes 702 and 705 are connected with an ammeter 706 via a direct current power source 709. Furthermore, the inner electrodes 703 and 704 are connected via a volt meter 707. An external magnetic field (H) 708 is applied to the MR elements 701 disposed in this manner. The directional arrows of the external magnetic field (H) are within the surface of the substrate and represent a direction perpendicular to that of the current flowing through the MR element. By means of the variable control of the value of this external magnetic field (H) within a range of ±20 koe, a measurement of the MR ratio is carried out.

In FIG. 7, the dimensions of MR elements 701 are such that length L=15 mm, width w=1 mm, and thickness D is within a range of from a few tens to a few hundreds of nm. Furthermore, with respect to the electrodes, the dimensions are such that the width of each electrode L3 is 1 mm, while the gap L1 between electrodes 702 and 703 (or between electrodes 704 and 705) is 0.5 mm, and the gap L2 between electrodes 703 and electrodes 704 is 10 mm.

BRIEF DESCRIPTION OF THE DRAWINGS

The above-mentioned and other features and advantages of this invention, and the manner of attaining them, will become more apparent and the invent ion will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

Figure 1:
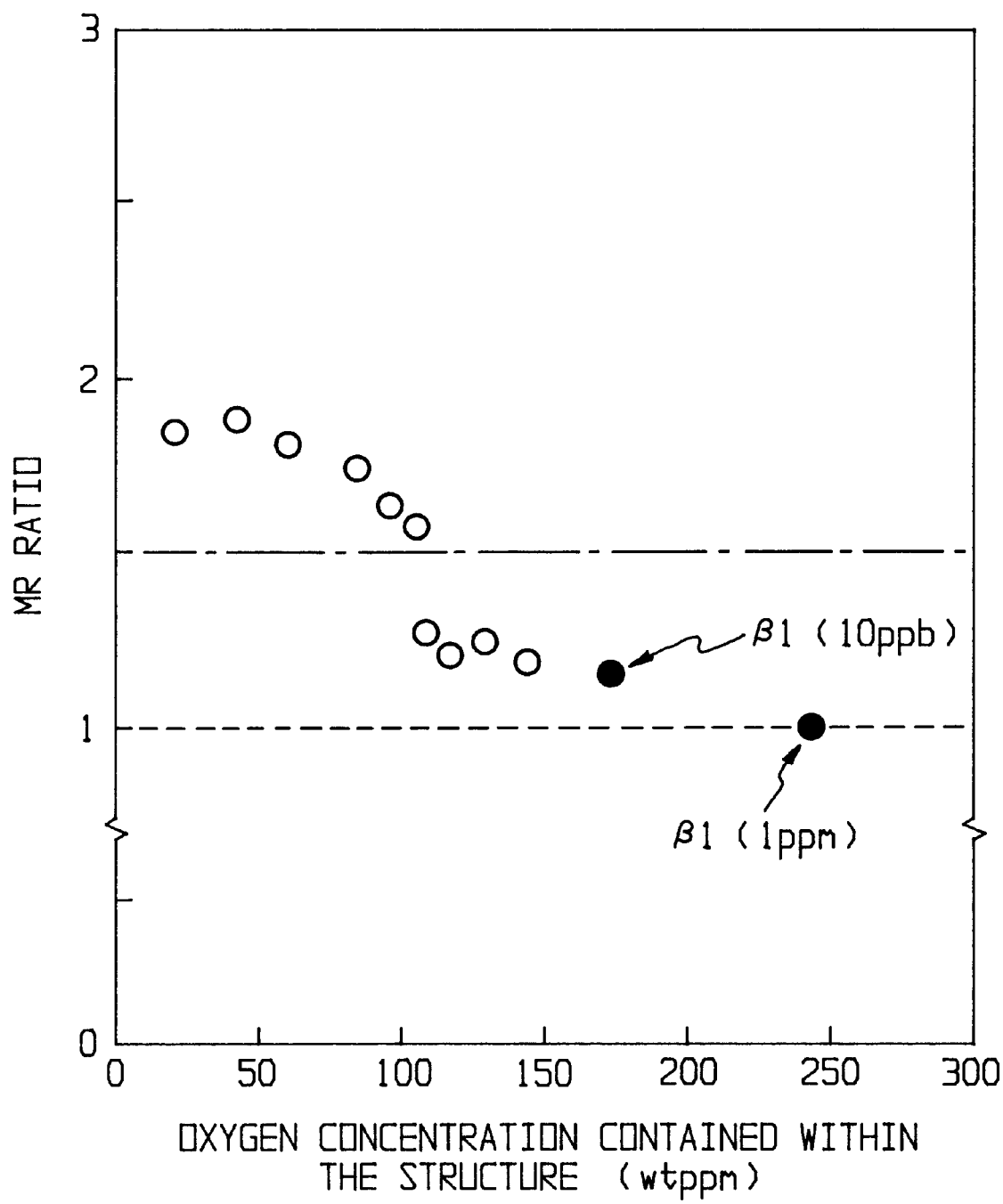
FIG. 1 is a graph showing the relationship between the oxygen concentration contained within the structure of embodiment 1 and comparative example 1, and the MR ratio of the magnetoresistance elements produced.

Below is a list of the reference numerals utilized in the present application:

| | | | |
|---|---|---|---|
| 500 | vacuum chamber, | 600 | vacuum chamber, |
| 501 | substrate body, | 601 | substrate body, |
| 502 | substrate body support platform, | 602, 603, 604 | cathodes, |
| | | 605 | deposition prevention plate, |
| 503, 504, 505, 506 | cathodes, | 606, 607, 608 | shutters, |
| | | 621 | ferromagnetic layer, |
| 507, 508 | Cu targets, | 622 | nonmagnetic layer (Cu), |
| 509, 510 | NiFe targets, | 623 | antiferromagnetic layer (FeMn), |
| 511 | deposition prevention plate, | 700 | glass substrate, |
| | | 701 | MR element, |
| 512, 513 | shutters, | 702, 703, 704, 705 | Au electrodes, |
| 521 | ferromagnetic layer (NiFe), | 706 | ammeter, |
| | | 707 | voltmeter, |
| 522 | nonmagnetic layer (Cu), | 708 | external magnetic field (H), |
| | | 709 | direct current power source. |

Hereinbelow, the present invention will discussed in greater detail using embodiments; however, the present invention is in no way limited to the embodiments described.

Embodiment 1

In the present embodiment, the effects will be discussed of reducing, in an artificial lattice type magnetoresistance element, the oxygen concentration contained in the nonmagnetic layers and the ferromagnetic layers. In order to confirm this effect, film formation was conducted in such a manner that the attained degree of vacuum within the film formation space was approximately $10^{-9}$ Torr, and the impurity concentration contained in the Ar gas used during the formation of the nonmagnetic layers and the ferromagnetic layers was varied within a range of 10 ppb to 1 ppm. The nonmagnetic layer was formed from Cu while the ferromagnetic layers were formed from FeNi.

Figure 5A:
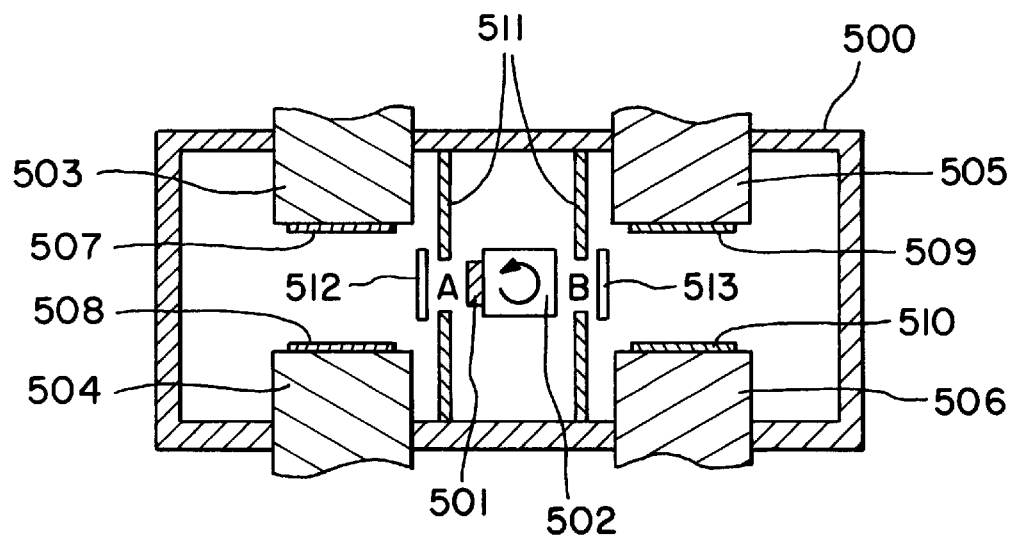
FIG. 5 is a schematic diagram showing a film formation device and an artificial lattice type magnetoresistance element in accordance with embodiment 1.

FIG. 5(*a*) is a cross-sectional view of an example of an opposed target type DC sputtering type which was employed to produce the magnetoresistance elements in the present embodiment. The inner walls of the vacuum chamber 500 were subjected to compound electropolishing. Furthermore, FIG. 5(*b*) shows a cross-sectional view of a sample produced.

Table 1 shows the film formation conditions during production of the magnetoresistance elements of the present embodiment.

TABLE 1

| ITEM | SET VALUE |
|---|---|
| 1) Substrate body material | Glass substrate (#7059) |
| 2) Substrate body size, shape | 20 mm square, 1 mm thick |
| 3) Substrate body surface: | |
| Average center line roughness | 0.05 nm (Ra) |
| Waviness period | 200 nm |
| 4) Attained vacuum degree (Torr) | Approximately $10^{-9}$ |
| 5) Impurity concentration in Ar gas | 10 ppb - 1 ppm |
| 6) Ar gas pressure (mTorr) | 3 |
| 7) Temperature at which substrate body surface maintained (° C.) | 20 (water cooling of substrate holder) |
| 8) Target material (wt %) | Cu, Ni - $Fe_{21.4}$ |
| 9) Target diameter (inches) | 6 |
| 10) Impurity concentration in target (ppm) | 90 (Cu) 1 (NiFe) |
| 11) Space between target and substrate body (mm) | 35 (Cu, NiFe) |
| 12) Power applied to target (W) | DC: 30 (Cu), DC: 50 (NiFe) |
| 13) Thickness of each layer produced (nm) | 1 (Cu), 2 (NiFe) |
| 14) Number of cycles of lamination of the nonmagnetic layer | 30 |

Hereinbelow, the production method for magnetoresistance elements of the present embodiment will be explained step by step. The numbers in parentheses refer to these steps.

(1) A glass substrate which was 20 mm square, had a thickness of 1 mm, and both surfaces of which were optically polished, was employed as the substrate body. The surface roughness of the substrate body, that is to say, the average center line roughness Ra, was 0.05 nm.

(2) Prior to the following film formation, the substrate body was subjected to washing using both mechanical and chemical methods, and was then dried using hot air or the like.

(3) After the drying was complete, the substrate 501 was set on a rotatable substrate body holder 502 comprising aluminum which was disposed in the center of the sputtering device. At this time, substrate 501 was set so as to face the film formation space 1 for NiFe film production (position A).

Here, what is meant by the center is the space provided between the film formation space 1 for NiFe film production and the film formation space 2 for Cu film production, which is bounded by shutters 512 and 513, and deposition prevention plates 511.

Subsequently, the interior of the sputtering device 500, that is to say, the center section and the two film formation spaces, were evacuated using a vacuum pump (not depicted in the figure) to an attained degree of vacuum of $3\times10^{-9}$ Torr or less.

(4) Ar gas was introduced into the two film formation spaces, and the gas pressure within film formation spaces 1 and 2 was set to 3 mTorr. The impurity concentration contained within the Ar gas employed was fixed at X (a fixed value within a range of 10 ppb to 1 ppm). Furthermore, the temperature at which the substrate body surface was maintained was 20° C., and this was accomplished by water cooling the substrate holder 502.

(5) A voltage of 50 W was applied by a DC power source (not depicted in the figure) to the cathodes 503 and 504 on which the NiFe targets 507 and 508 were disposed, and a plasma was generated. Furthermore, a voltage of 30 W was applied by a DC power source (not depicted in the figure) to cathodes 505 and 506, on which Cu targets 509 and 510 were disposed, and a plasma was generated. As a result, the NiFe targets 507 and 508, and the Cu targets 509 and 510, were placed in a sputtering state.

(6) While maintaining the state described in (5) above, shutter 512 was opened and a NiFe layer having a thickness of 2 nm was formed on the surface of the substrate body 501, which was in a position parallel to the center line connecting NiFe targets 507 and 508. The film thickness was controlled by the amount of time the shutter 512 was opened.

(7) The substrate body holder was next rotated by 180° C., and the substrate body 501 was moved to a direction facing the film formation space 2 for Cu film production (position B).

(8) While maintaining the state described in (5) above, shutter 513 was opened, and a Cu layer having a thickness of 1 nm was formed on the surface of the substrate body 501, on which the NiFe layer had previously been formed, and which was in a position parallel to the center line connecting the opposed Cu targets 509 and 510. The film thickness was controlled by means of the time during which the shutter 513 was opened.

(9) The substrate body holder 502 was subsequently again rotated, and substrate body 501 was moved to a direction facing the film formation space 1 for NiFe film production (position A).

Figure 5B:
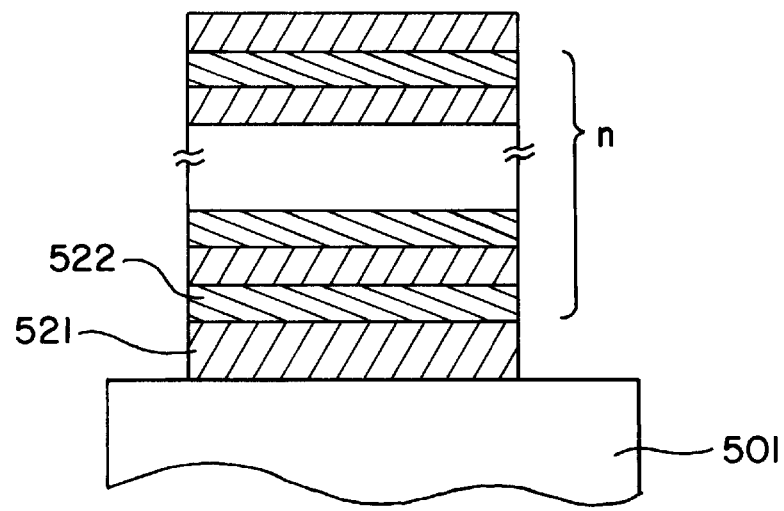

(10) Steps (6)–(9) were repeated 30 times, and a sample all having the structure shown in FIG. 5(b) was produced.

Targets were used which had an extremely limited degree of impurities. The composition of the target used for NiFe film formation was as follows: Fe comprised 21.4 wt %, while Ni comprised the balance and the impurities contained therein were such that Si<10, Cu:11, Al<10, O:90, N<10 (wt. ppm.). Furthermore, the impurities present in the target used for Cu film formation were such that Ni <0.05, Fe <0.05, C <O<1, and N <1 (wt. ppm.).

Comparative Example 1.

In this example, the difference in the procedure from that employed in embodiment 1 was that the attained degree of vacuum within the film formation chamber was approximately $10^{-7}$ Torr. Furthermore, the impurity concentration contained within the Ar gas was set to either 10 ppb or 1 ppm.

The other points were identical to those in embodiment 1.

The sample produced in this example is designated $\beta 1$ (i). Here, i indicates the impurity concentration contained in the Ar gas. In FIG. 1, the MR ratio of the magnetoresistance elements produced are indicated by a white circle (for sample $\alpha$) and a black circle (for sample $\beta$). The horizontal axis in FIG. 1 indicates the oxygen concentration contained within the structure comprising NiFe and Cu. The measurement of this oxygen concentration was conducted by means of SIMS. The vertical axis in FIG. 1 indicates the MR ratio as measured by means of the direct current four terminal method shown in FIG. 7; this was standardized to the 131 (1 ppm) of comparative example 1, corresponding to a conventional example. During measurement, a magnetic field H (maximum applied magnetic field=20 kOe) was applied so as to be in a direction parallel to the surface of the structure and perpendicular to the current running through the magnetoresistance elements.

Figure 7:
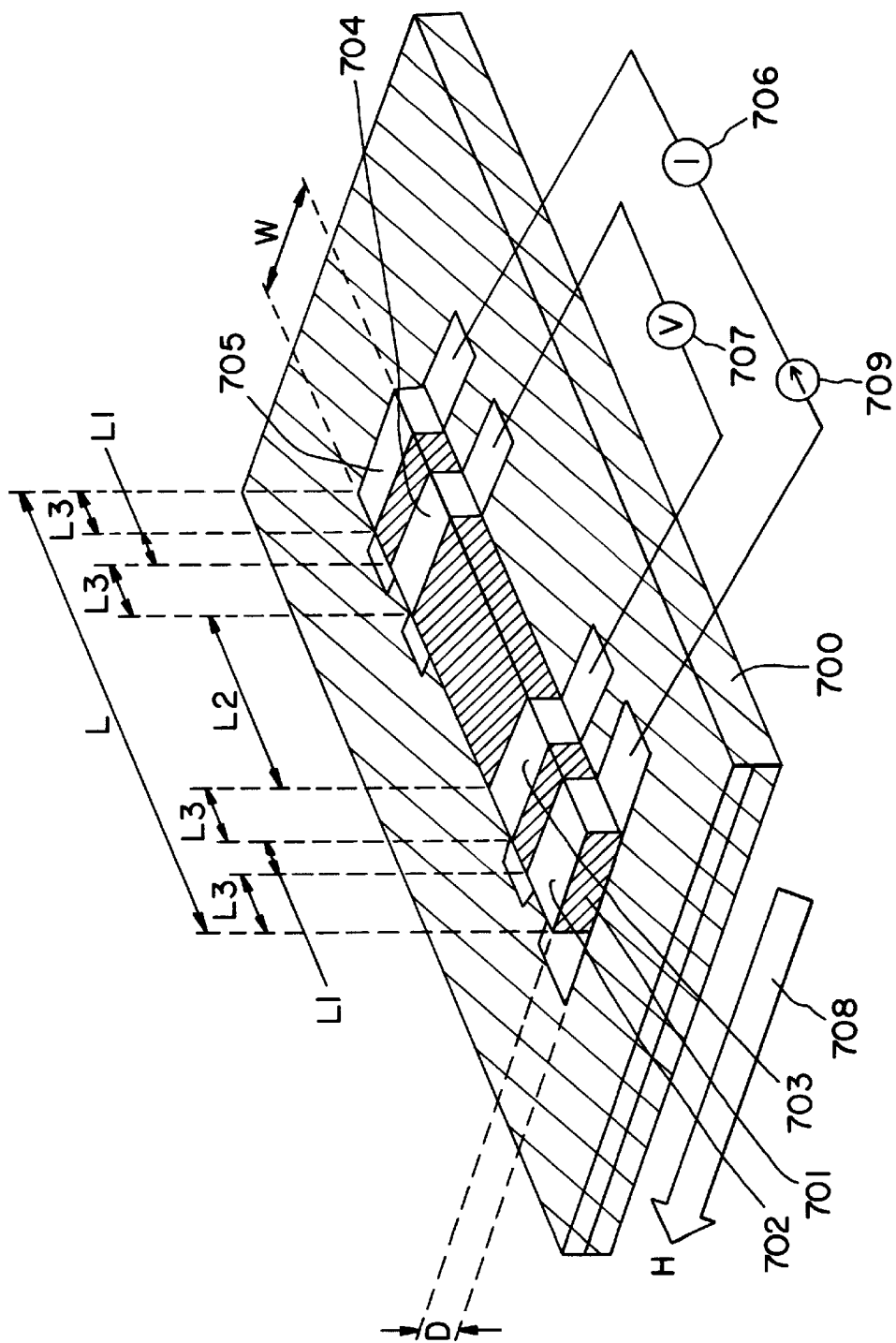
FIG. 7 is a schematic diagram showing a MR ratio measurement system comprising a direct current four terminal method in accordance with the present invention.

In FIG. 7, reference 700 indicates a glass substrate body, reference 701 indicates a structure comprising NiFe and Cu (with a thickness D), and references 702–705 indicate electrodes comprising Au (having a thickness of 500 nm and a width of 1 mm). A meter 706 was connected with electrode 702 and 705 via wiring. Furthermore, voltmeter 707 was connected with electrode 703 and 704 via wiring. The soldering method was used to connect the wires with the electrodes. Furthermore, the size of the structure was such that L=15 mm, L1=0.5 mm, L2=10 mm, and w=1 mm.

From FIG. 1, the following experimental results were obtained.

(1) From a comparison of $\beta 1$ (10 ppb) and $\beta 1$ (1 ppm), it was learned that even when the attained degree of vacuum within the film formation chamber was $10^{-7}$ Torr, a somewhat higher MR ratio was obtained when Ar gas having a low impurity concentration was employed. However, the oxygen concentration contained within the structure did not change very much.

(2) In the case of $\alpha 1$, as the impurity concentration contained within the Ar gas was reduced, the MR ratio increased markedly. In particular, when the oxygen concentration contained within the structure reached a level of 100 wt. ppm. or less, a magnetoresistance element was obtained which had a MR ratio which was 50% higher than that of conventional elements (more than 1.5 on the vertical axis).

Accordingly, it was learned from embodiment 1 and comparative example 1 that it is possible to form a magnetoresistance element having a high MR ratio when the oxygen concentration contained in a structure having a plurality of layers in which ferromagnetic layers sandwich nonmagnetic layers is less than 100 wt. ppm. or less.

Embodiment 2

In the present embodiment, the effects will be described of limiting the oxygen concentration contained in the nonmagnetic layers, the ferromagnetic layers and the antiferromagnetic layer of a spin valve type magnetoresistance element. In order to confirm this effect, film formation was conducted such that the attained degree of vacuum within the film formation chamber was set at approximately $10^{-9}$ Torr, and the impurity concentration contained in the Ar gas used during the formation of the nonmagnetic layers and ferromagnetic layers was varied within a range of 10 ppb to 1 ppm. The nonmagnetic layer was formed from Cu, the ferromagnetic layers were formed from FeNi, and the antiferromagnetic layer was formed from FeMn.

Figure 6A:
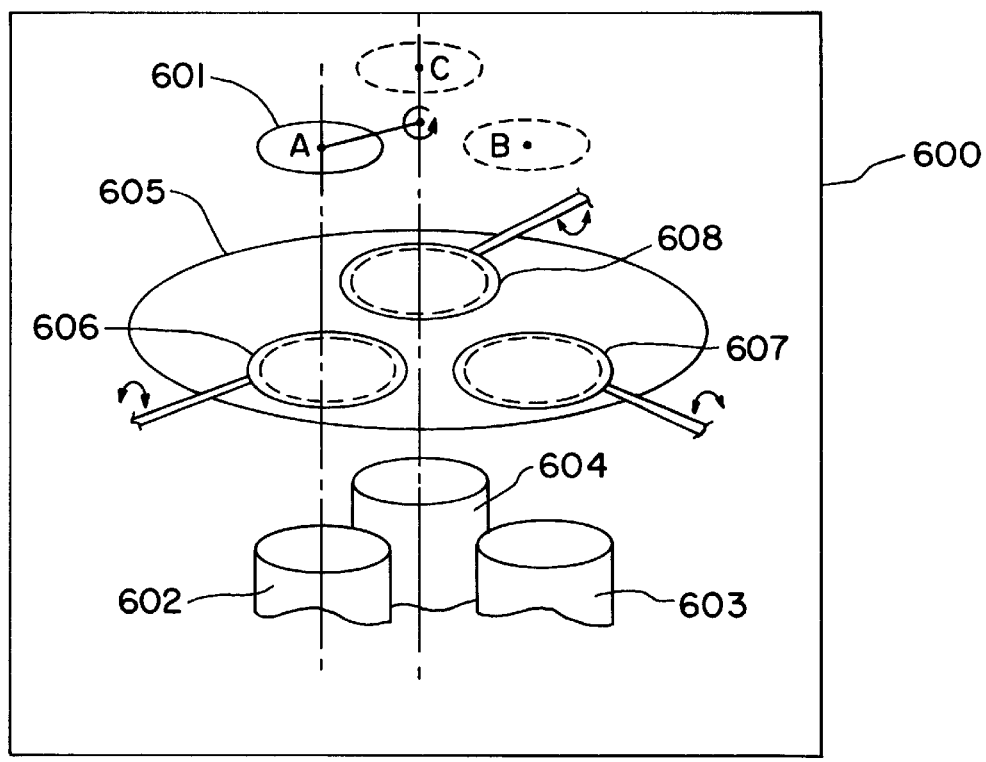
FIG. 6 is a schematic diagram showing a film formation device and a spin valve type magnetoresistance element in accordance with embodiment 2.
Figure 6B:
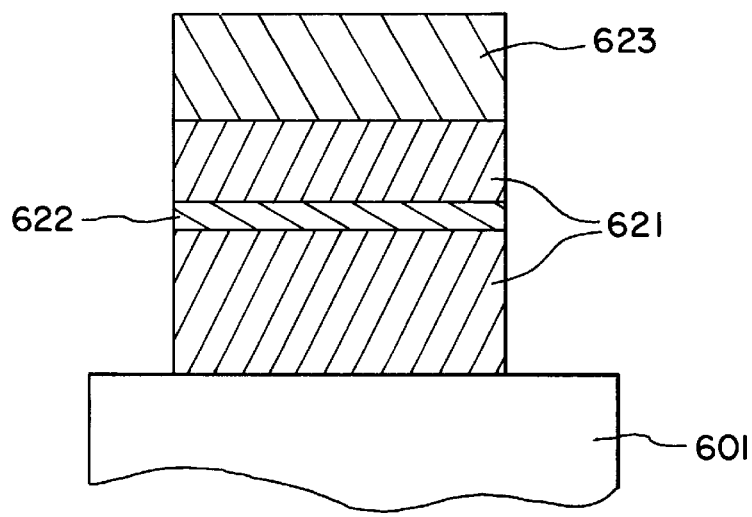

FIG. 6(a) shows a cross-sectional view of an example of a DC magnetron sputtering device used in producing the magnetoresistance elements in the present embodiments. The inner walls of vacuum chamber 600 were subjected to compound electropolishing. Furthermore, FIG. 6(b) is a cross-sectional view showing a sample which is produced.

Table 2 shows the film formation conditions during the production of the magnetoresistance elements of the present embodiment.

TABLE 2

| ITEM | SET VALUE |
|---|---|
| 1) Substrate body material | Glass substrate (#7059) |
| 2) Substrate body size, shape | 20 mm square, 1 mm thick |
| 3) Substrate body surface: | |
| Average center line roughness | 0.05 nm (Ra) |
| Waviness period | 200 nm |
| 4) Attained vacuum degree (Torr) | Approximately $10^{-9}$ |
| 5) Impurity concentration in Ar gas | 10 ppb - 1 ppm |
| 6) Ar gas pressure (mTorr) | 3 |
| 7) Temperature at which substrate body surface maintained (0° C.) | 20 (water cooling of substrate holder) |
| 8) Target material (wt %) | Cu, Ni - $Fe_{21.4}$, Fe - $Mn_{30}$ |
| 9) Target diameter (inches) | 3 |

TABLE 2-continued

| ITEM | SET VALUE |
|---|---|
| 10) Impurity concentration in target (ppm) | 90 (Cu), 1 (NiFe), 5 (FeMn) |
| 11) Space between target and substrate (mm) | 35 (all targets) |
| 12) Power applied to target (W) | DC: 35 (Cu), DC: 50 (NiFe), DC: 50 (FeMn) |
| 13) Thickness of each layer produced (nm) | 10 (1st NiFe layer), 2.2 (Cu) layer), 5 (2nd NiFe layer), 7 (FeMn layer) |
| 14) Layer structure | Substrate body/1st NiFe layer/Cu layer/2nd Nife layer/FeMn layer |

Hereinbelow, the production method for magnetoresistance elements of the present embodiment will be explained step by step. The numbers within the parentheses refer to these steps.

(1) A glass substrate, which was 20 mm square, the thickness of which was 1 mm, and both surfaces of which were optically polished, was used as the substrate body. The surface roughness of the substrate, that is to say, the average center line roughness Ra, was 0.05 nm.

(2) Prior to the following film formation, the substrate body described above was washed using both mechanical and chemical methods, and was then dried using hot air or the like.

(3) After drying, the substrate body was set on a substrate holder 602 which was supported on an arm attached to a rotating axle disposed in the central part of the sputtering device. At this time, the substrate was set so that the surface on which the film was to be formed was opposed to the cathode 602 on which the NIFe target was disposed (position A).

Here, the space in which the substrate body holder 601 was present and the space in which the cathode 602 was present were separated by deposition prevention plate 605 and shutter 606.

After this, the interior of the sputtering device 600, that is to say, the two spaces described above, were evacuated using a vacuum pump (not depicted in the figure) so as to reach an attained vacuum degree of $3 \times 10^{-9}$ Torr or less.

(4) Ar gas was introduced into these two spaces, and the gas pressure was set to 3 mTorr. The impurity concentration contained in the Ar gas employed was set to X (a fixed value within a range of 10 ppb to 1 ppm). Furthermore, the temperature at which the surface of the substrate body was maintained was 20 C, and this was accomplished by water cooling the substrate holder 601.

(5) A voltage of 50 W was applied by a DC power source (not depicted in the figure) to the cathode 606 on which the NiFe target was disposed, and a plasma was generated. Furthermore, a voltage of 35 W was applied by a DC power source (not depicted in the figure) to cathode 607 on which the Cu target was disposed, and a plasma was generated. Furthermore, a voltage of 50 W was applied by a DC power source (not depicted in the figure) to cathode 607, on which the FeMn target was disposed, and a plasma was generated.

As a result, these 3 targets were simultaneously placed in a sputtering state.

(6) While maintaining the state described in (5) above, shutter 606 was opened, and on the surface of the substrate body, the center of which was on the same line as the center of the opposed NiFe target, a NiFe layer having a thickness of 10 nm was formed. The thickness was controlled by means of the time during which the shutter 606 was opened.

(7) The substrate body holder 601 was then rotated by 120° C. in the order of operation, and the substrate body was moved to position B, directly opposed to cathode 603 on which the Cu target was disposed.

(8) In the state described in (7) above, shutter 607 was opened and a Cu layer having a thickness of 2.2 nm was formed on the surface of the substrate body, the center of which was on the same line as the center of the opposed Cu target. The film thickness was controlled by means of the time during which shutter 607 was opened.

(9) The substrate body holder 601 was next rotated by 120 in the opposite direction, and the substrate body was moved to position A, opposite the cathode 602 on which the NiFe target was disposed.

(10) In the state described in (9) above, shutter 606 was opened, and a NiFe layer having a thickness of 5 nm was formed on the surface of the substrate body, the center of which was on the same line as the center of the opposing NiFe target. The thickness of the film was controlled by means of the time during which shutter 606 was opened.

(11) Substrate body holder 601 was next rotated by 120° C. in the opposite direction, and the substrate body was moved to position C, opposite to the cathode 604 on which the FeMn target was disposed.

(12) In the state described in (11) above, shutter 608 was opened and a FeMn layer having a thickness of 7 nm was formed on the surface of the substrate body, the center of which was on the same line as the center of the opposing FeMn target. The thickness was controlled by means of the time during which shutter 608 was open.

(13) By means of steps (1)–(12) above, the sample α2 having the structure shown in FIG. 6(b) was produced.

The targets employed had an extremely low level of impurities. The composition of the target used for FeMn film formation contained 50.0 wt % of Fe, the balance being Mn, and the impurities were such that: Co:33, Al:18, 0:240, N:110 (wt. ppm.). Furthermore, the target used for NiFe film formation and the target used for Cu film formation were identical to those used in embodiment 1.

Comparative Example 2

In the present example, the difference from the procedure of embodiment 2 was that the attained degree of vacuum within the film formation chamber was approximately $10^{-7}$ Torr. Furthermore, the impurity concentration contained within the Ar gas was 10 ppb or 1 ppm.

The other points were identical to those of embodiment 2.

The sample produced in the present example was termed β1 (i). Here, i indicates the impurity concentration contained within the Ar gas.

Figure 2:
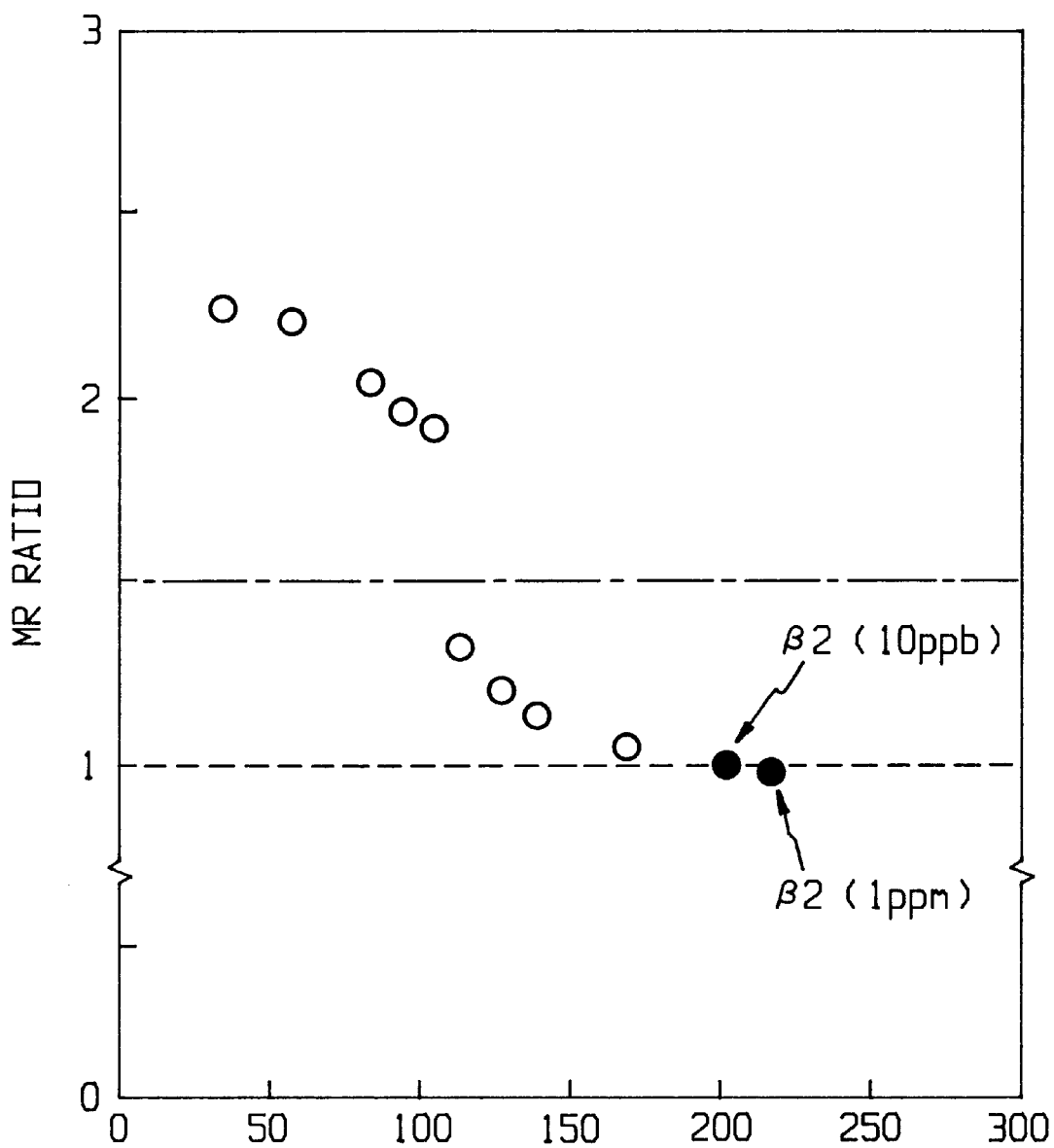
FIG. 2 is a graph showing the relationship between the oxygen concentration contained in the structure of embodiment 2 and comparative example 2, and the MR ratio of the magnetoresistance elements produced.

In FIG. 2, the MR ratio of the magnetoresistance elements produced is indicated by a white circle (for sample α) and a black circle (for sample β). The horizontal axis in FIG. 2 indicates the oxygen concentration present in the laminated portion in which ferromagnetic layers sandwich the non-magnetic layer. The measurement of this oxygen concentration was conducted by means of SIMS. The vertical axis in FIG. 2 shows the MR ratio as measured by the direct current four terminal method depicted in FIG. 7; this is standardized to β2 (1 ppm) of comparative example 2, which corresponds to a conventional example. During measurement, a magnetic field H (maximum applied magnetic field 20 kOe) was applied in a direction so as to be parallel to the surface of the structure and perpendicular to current running through the magnetoresistance elements.

The other points were identical to those in embodiment 1.

From FIG. 2, the following experimental data was obtained.

(1) It was learned from a comparison of β2 (10 ppb) and β2 (1 ppm) that when the attained degree of vacuum within the film formation chamber was approximately $10^{-7}$ Torr, irrespective of the impurity concentration within the Ar gas, no change was seen in the oxygen concentration within the structure or the MR ratio.

(2) In the case of al, as the impurity concentration contained within the Ar gas was reduced, the MR ratio increased markedly. In particular, within this structure, as the oxygen concentration contained within the laminated portion in which the ferromagnetic layers sandwiched the nonmagnetic layer reached a level of 100 wt. ppm. or less, it was possible to obtain magnetoresistance elements having MR ratios which were 50% higher than those conventionally obtainable (1.5 or more along the vertical axis).

Accordingly, from embodiment 2 and comparative example 2, it can be seen that within the spin valve type structure, when the oxygen concentration contained in the laminated portion in which the ferromagnetic layers sandwich the nonmagnetic layer reaches a level of 100 wt. ppm. or less, it is possible to form magnetoresistance elements having a high MR ratio.

From the above described embodiment 1, embodiment 2, comparative example 1, and comparative example 2, it was determined that by using Ar having an impurity concentration of 10 ppb or less as the film formation gas after the back pressure within the film formation chamber was reduced to approximately $10^{-9}$ Torr, and by forming the nonmagnetic layer, the ferromagnetic layers, and the antiferromagnetic layer using a sputtering method, magnetoresistance elements having satisfactory MR ratios were obtained.

Embodiment 3.

In the present embodiment, the point of difference from embodiment 2 was that a laminated film containing a Co monolayer, a NiFe film and a Co film was used as the ferromagnetic layer, and a mixed film containing the non-magnetic elements Cu (0.3 wt %), Mo (0.3 wt %), and Nb (0.3 wt %) was used as the NiFe alloy film. The layer structure of the magnetoresistance element and the total film thickness thereof were identical to those in embodiment 2. A four cathode film formation device was employed.

The other points were identical to those of embodiment 2.

The type of ferromagnetic layer, and the layer structure thereof, are shown in Table 3.

TABLE 3

Figure 3:
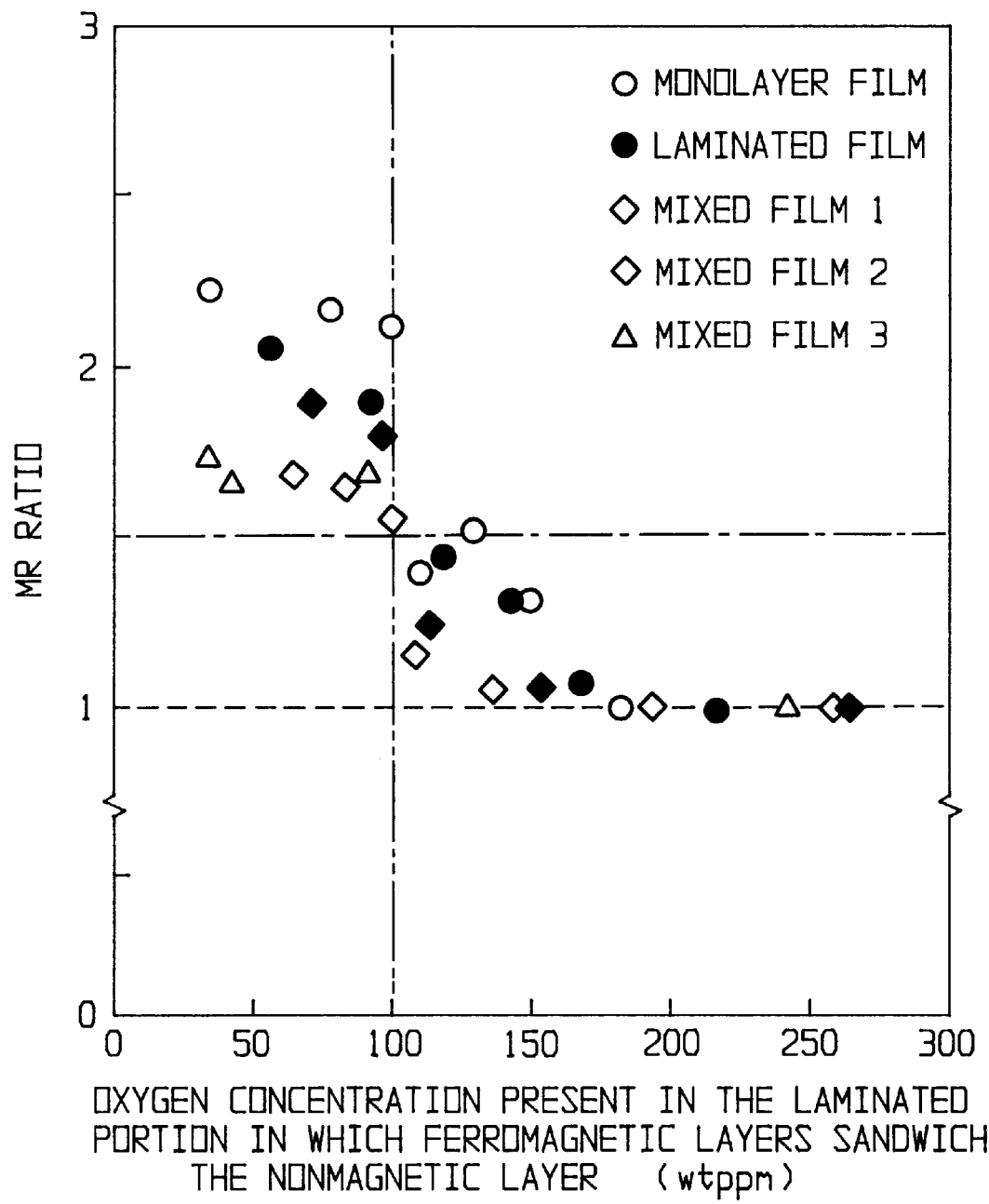
FIG. 3 is a graph showing the relationship between the type of ferromagnetic layer of embodiment 3 and the MR ratio of the magnetoresistance elements produced.

| Type of Ferromagnetic Layer | Layer Structure of Ferromagnetic Layer (thickness: nm) | | Symbol in FIG. 3 |
|---|---|---|---|
| | 1st Ferromagnetic Layer | 2nd Ferromagnetic Layer | |
| Monolayer Film | Co (10) | Co (5) | White circle |
| Laminated Film | NiFe (7) Co (3) | NiFe (3) Co (2) | Black circle |
| Mixed Film 1 | NiFeCu (10) | NiFeCu (5) | White diamond |
| Mixed Film 2 | NiFeMo (10) | NiFeMo (5) | Black diamond |
| Mixed Film 3 | NiFeNb (10) | NiFeNb (5) | White triangle |

FIG. 3 shows the experimental results of this embodiment. It can be seen from FIG. 3 that independent of the type of ferromagnetic layer, when the oxygen concentration contained within the laminated portion in which the ferromagnetic layers sandwich a nonmagnetic layer in this structure reaches a level of 100 wt. ppm. or less, then the MR ratio increases markedly in comparison with the case in which the oxygen concentration was higher than 100 wt. ppm.

Furthermore, it was determined that when the nonmagnetic element is one selected from a group containing Cu, Mo, and Nb, the MR ratio increases.

Furthermore, the fact that the same results were obtained with magnetoresistance elements having the structure shown in embodiment 1 was independently confirmed.

Embodiment 4

In the present embodiment, in place of the Cu used in embodiment 2, a monolayer film comprising Ag, Pd, Au, or Pt was employed as the nonmagnetic layer.

The other points were identical to those of embodiment 1.

Figure 4:
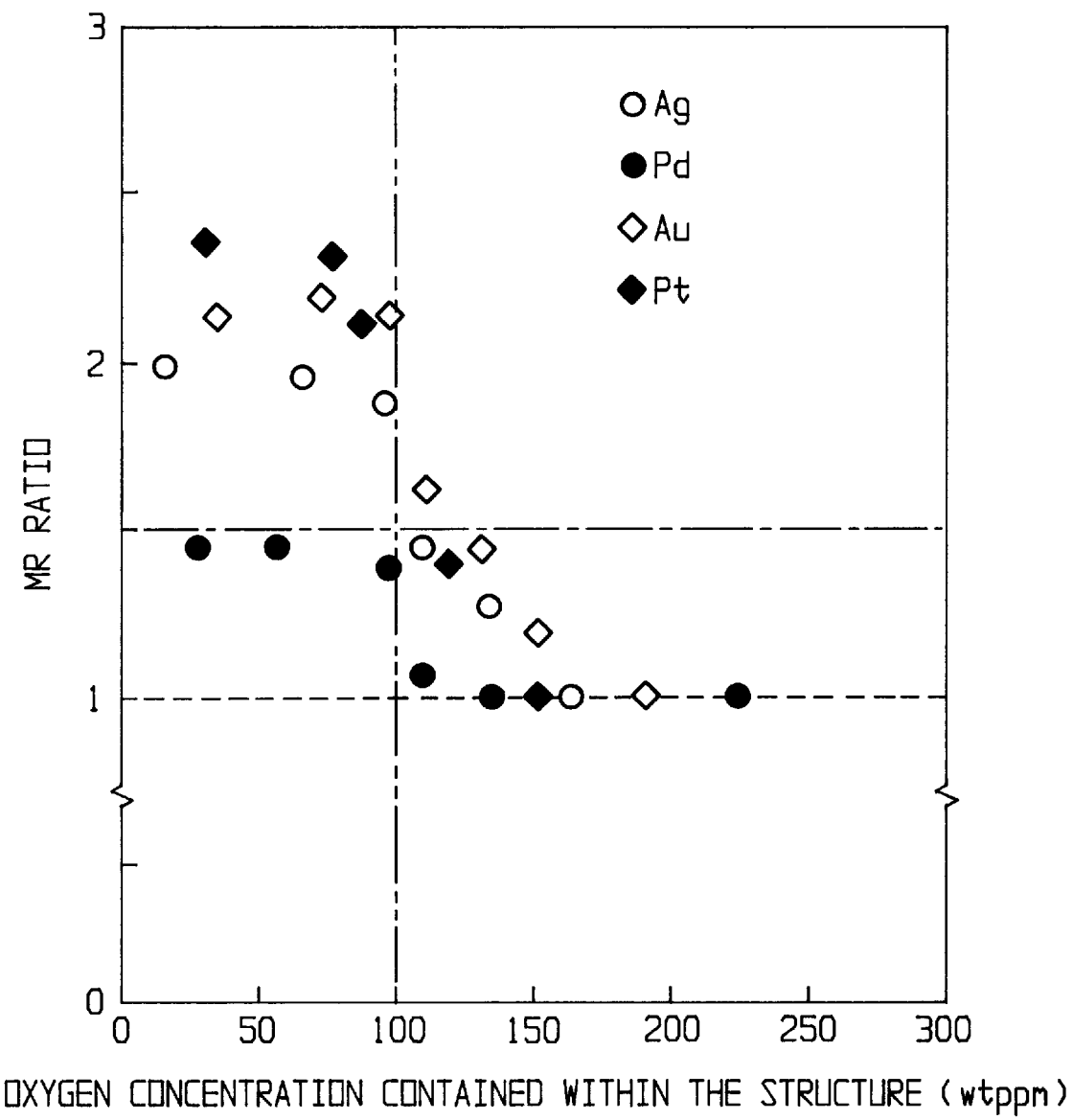
FIG. 4 is a graph showing the relationship between the type of nonmagnetic layer of embodiment 4 and the MR ratio of the magnetoresistance elements produced.

FIG. 4 shows the experimental results of the present embodiment. In FIG. 4, a white circle represents the case in which Ag was employed, a black circle represents the case in which Pd was employed, a white diamond indicates the case in which Au was employed, and a black diamond indicates the case in which Pt was employed.

From FIG. 4, it can be seen that independent of the type of nonmagnetic layer, when the oxygen concentration contained within the structure reaches a level of 100 wt. ppm. or less, then the MR ratio obtained increases in comparison with the case in which the oxygen concentration was higher than 100 wt. ppm.

Furthermore, it was independently confirmed that these results also apply when a magnetoresistance element having the structure of embodiment 2 was used.

Embodiment 5

In the present embodiment, in place of the FeMn used in embodiment 2, NiMn, NiO, and CoFeMn were employed as the antiferromagnetic layer.

The other points were identical to those of embodiment 2.

Figure 8:
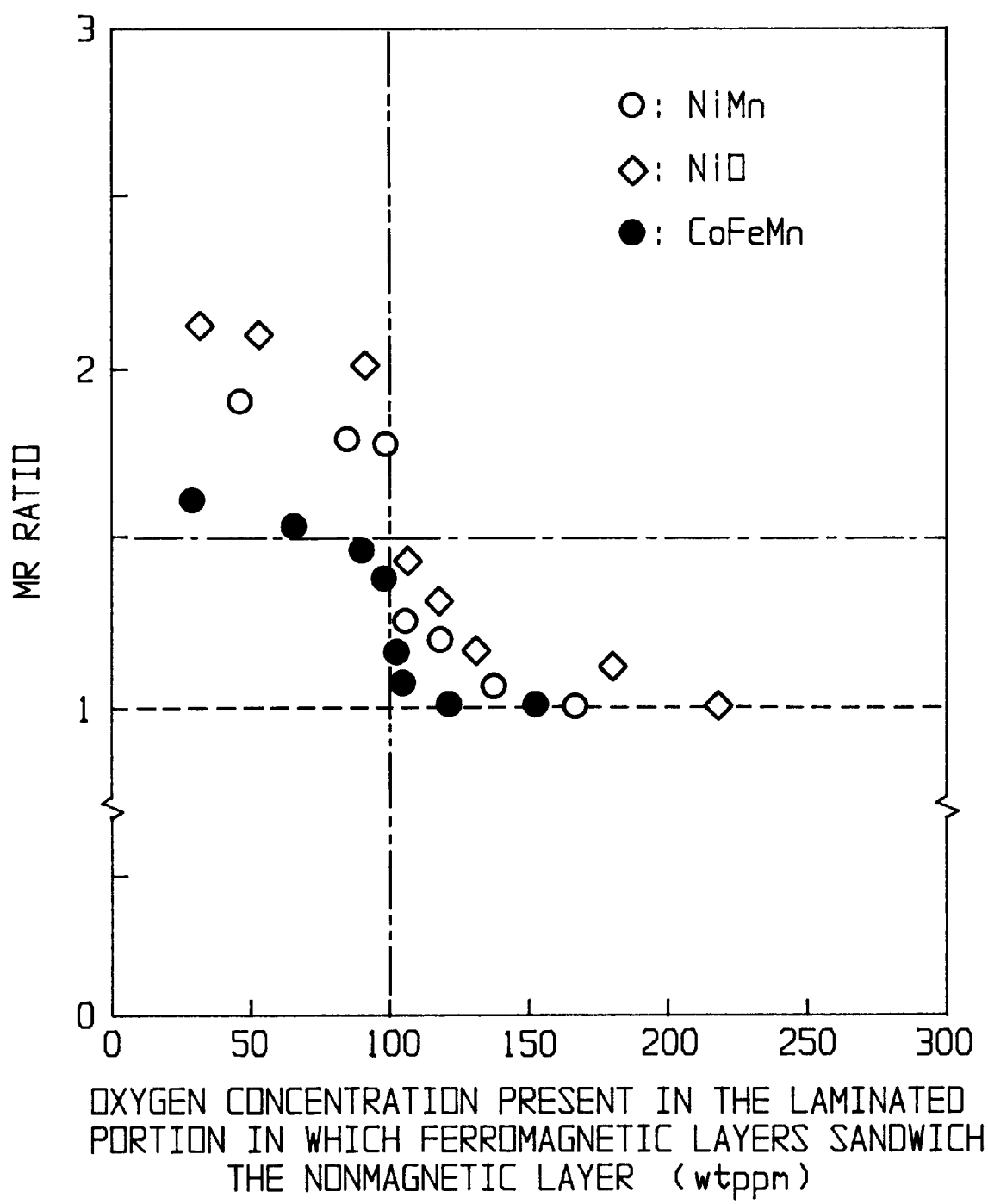
FIG. 8 is a graph showing the relationship between the type of antiferromagnetic layer of embodiment 5 and the MR ratio of the magnetoresistance element produced.

FIG. 8 shows the experimental results of this embodiment. In FIG. 8, a white circle indicates the case in which NiMn was employed, a white diamond indicates the case in which NiO was employed, and a black circle indicates the case in which CoFeMn was employed.

From FIG. 8, it can be seen that independent of type of antiferromagnetic layer, when the oxygen concentration contained in the laminated portion in which the ferromagnetic layers sandwich the nonmagnetic layer, in this structure, reaches a level of 100 wt. ppm. or less, then the MR ratio increases in comparison with the case in which the oxygen concentration was greater than 100 wt. ppm.

In embodiments 1 through 5, a glass substrate (#7059) was employed; however, the material used for the substrate body is not important insofar as it is not magnetic. That is to say, a nonmagnetic film may be provided on the nonmagnetic substrate as a base layer for the structure forming the artificial lattice or the spin valve type.

In particular, with the purpose of providing the nonmagnetic layer, examples of this include the control of the flatness of the substrate body surface, the control of the degree of cleanliness of the substrate body surface, or the prevention of the introduction of ions harmful to the artificial lattice type or spin valve type structure.

Furthermore, in order to protect the magnetoresistance element physically and environmentally, an appropriate protective layer may be provided on the artificial lattice type or spin valve type structure.

Hereinbelow, the results of consideration of the base layer or the protective layer described above will be given.

Embodiment 6

In the present embodiment, the case is considered in which a monolayer film comprising Cu is provided as a base layer and/or protective layer. The spin valve type structure shown in embodiment 2 was employed as the magnetoresistance element. As a comparative example, the case is shown in which neither a base layer or a protective layer is provided. The other points were identical to those of embodiment 2.

The base layer and protective layer are produced before and after the formation of the structure, in a continuous manner and in a state in which the vacuum within the film formation chamber is maintained. The temperature of the substrate body during formation of the base layer and the protective layer is identical to that during the formation of the structure; that is to say, the temperature is fixed at 20° C. Furthermore, the thickness of the base layer and the protective layer is 10 nm.

Table 4 shows the MR ratio after storage for 200 hours in an atmosphere having a temperature of 80° C. and a humidity of 80% (constant temperature constant humidity test). The MR ratios shown in Table 4 are values standardized against the MR ratios prior to the constant temperature constant humidity test.

TABLE 4

| Setting Conditions | | |
| --- | --- | --- |
| Base layer | Protective layer | MR Ratio |
| Absent | Absent | 0.35 |
| Absent | Present | 0.83 |
| Present | Absent | 0.67 |
| Present | Present | 0.96 |

It can be seen from Table 4 that providing a monolayer film comprising Cu at least as a base layer and/or protective layer permits the maintenance of a higher MR ratio than the case in which neither such a base layer or a protective layer are provided.

The effect described above is essentially identical in the case in which a monolayer film comprising one element selected from a group containing Ta, W, Ti, and Cr is used as a base layer and/or a protective layer.

Furthermore, the effect described above was shown to be reproducible even in the case in which a laminated film comprising differing monolayer films was employed as the base layer and/or the protective layer.

Additionally, in the present embodiment, the case of the spin valve type structure was considered; however, it was confirmed elsewhere that the technology of the present embodiment is sufficiently applicable even in the case of a artificial lattice type structure.

Embodiment 7

In the present embodiment, the effects on the MR ratio of an alteration in the surface roughness (Ra) and waviness period of the substrate body were investigated. When the surface roughness of the substrate body was varied within a range of 0.02 nm to 5 nm, the waviness period was within a range of 150 to 250 nm. Furthermore, when the waviness period was varied within a range of 20 nm to 500 nm, the surface roughness of the substrate was 0.05 nm or less.

The other points were identical to those of Embodiment 2.

Figure 9:
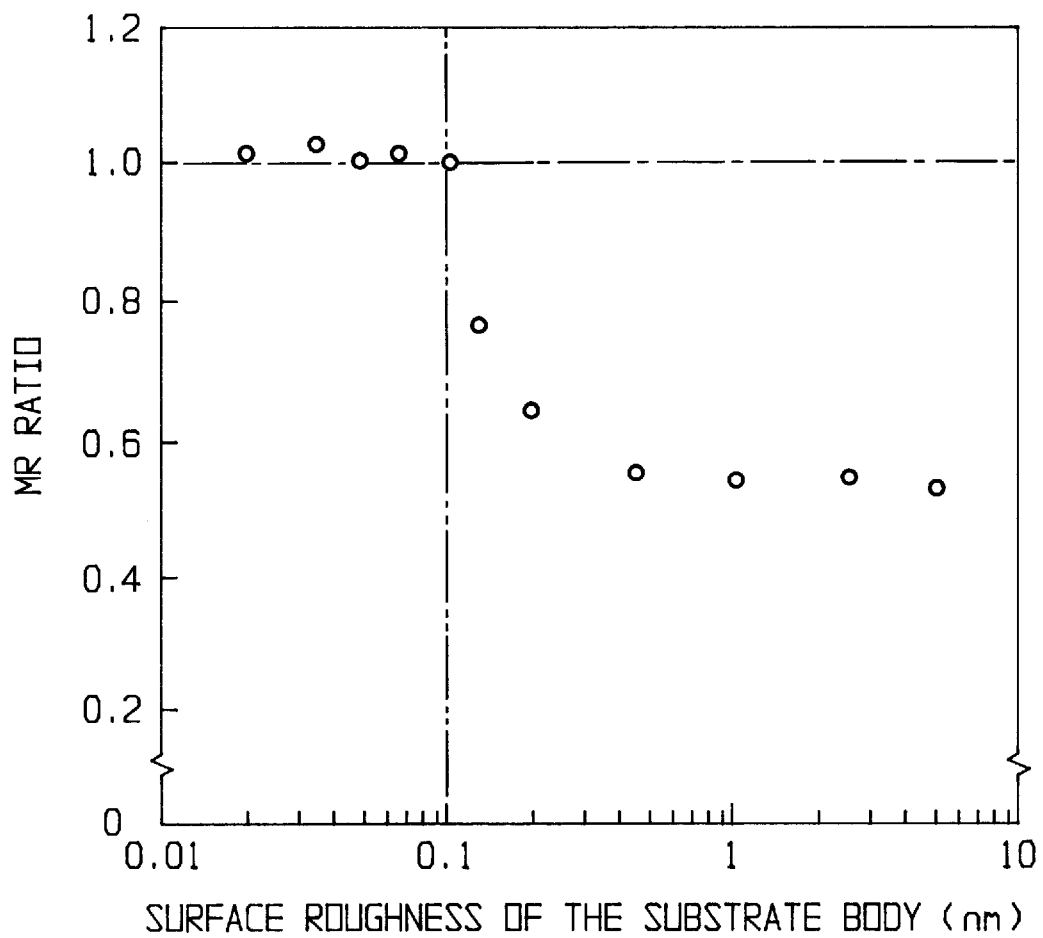
FIG. 9 is a graph showing the relationship between the surface roughness of the substrate body of embodiment 7 and the MR ratio of the magnetoresistance element produced.
Figure 10:
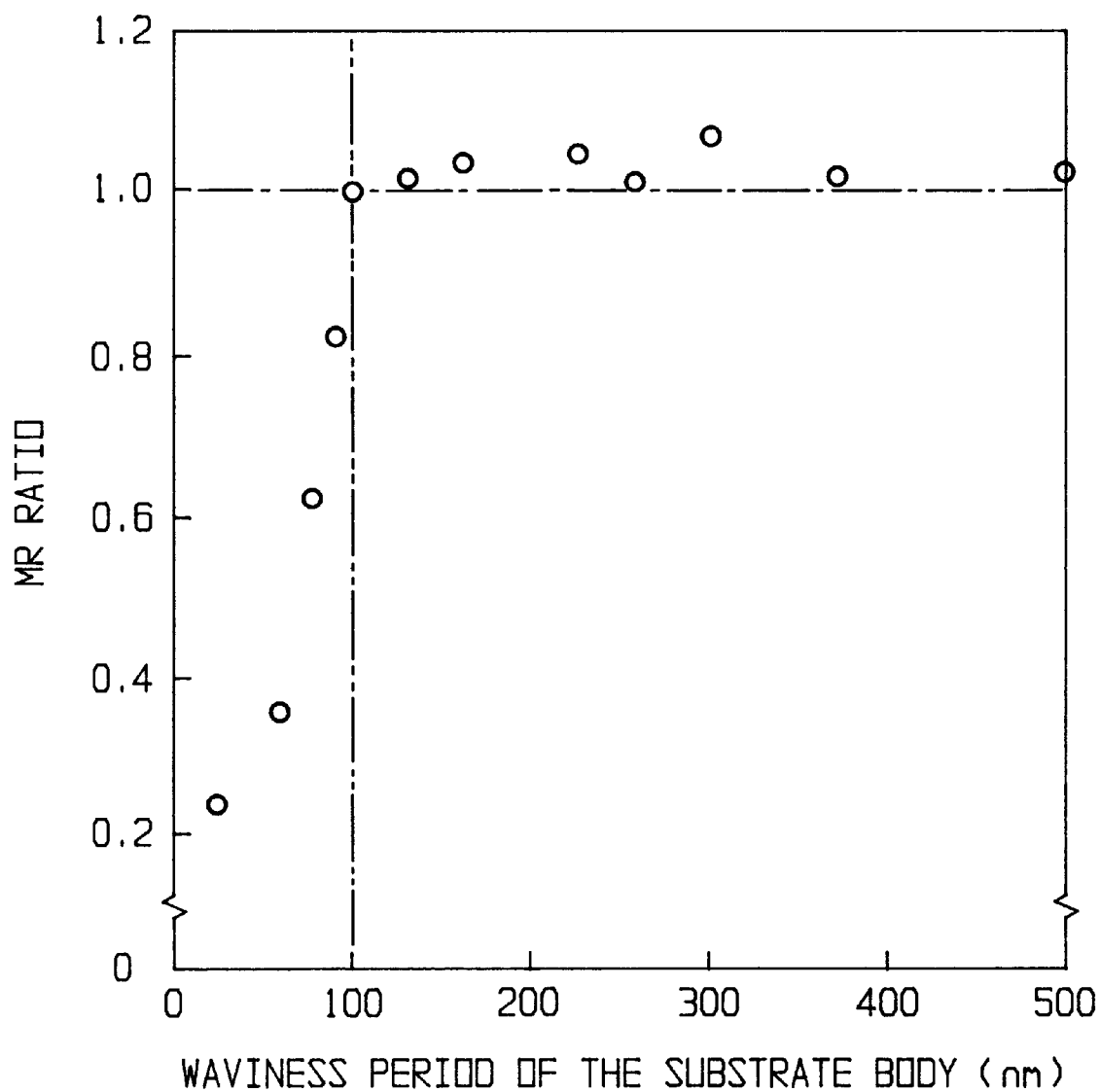
FIG. 10 is a graph showing the relationship between the waviness period of the substrate body of embodiment 7 and the MR ratio of the magnetoresistance element produced.

FIG. 9 is a graph showing this dependence on the surface roughness of the substrate body. FIG. 10 is a graph showing the dependence on the waviness period of the substrate body. It can be seen from FIG. 9 that when Ra is greater than 0.1 nm, the MR ratio decreases. On the other hand, it can be seen from FIG. 10 that when the waviness period is smaller than 100 nm, the MR ratio decreases.

Accordingly, by setting the surface of the substrate body so that Ra is 0.1 nm or less and the waviness period is 100 nm or more, it was possible to produce magnetoresistance elements which stably possessed high MR ratios.

Furthermore, this effect was elsewhere confirmed with respect to magnetoresistance elements having the structure shown in embodiment 1.

Embodiment 8

In the present embodiment, the effects on the MR ratio when the surface roughness (Ra) and the waviness period of the outermost surface of the structure were varied was investigated. When the surface roughness of the outermost surface of the structure was altered within a range of 0.03 nm to 10 nm, the waviness period was within a range of 150 to 250 nm. Furthermore, when the waviness period was altered within a range of 10 nm to 700 nm, the surface roughness of the substrate body was 0.05 nm or less.

The other points were identical to those of embodiment 2.

Figure 11:
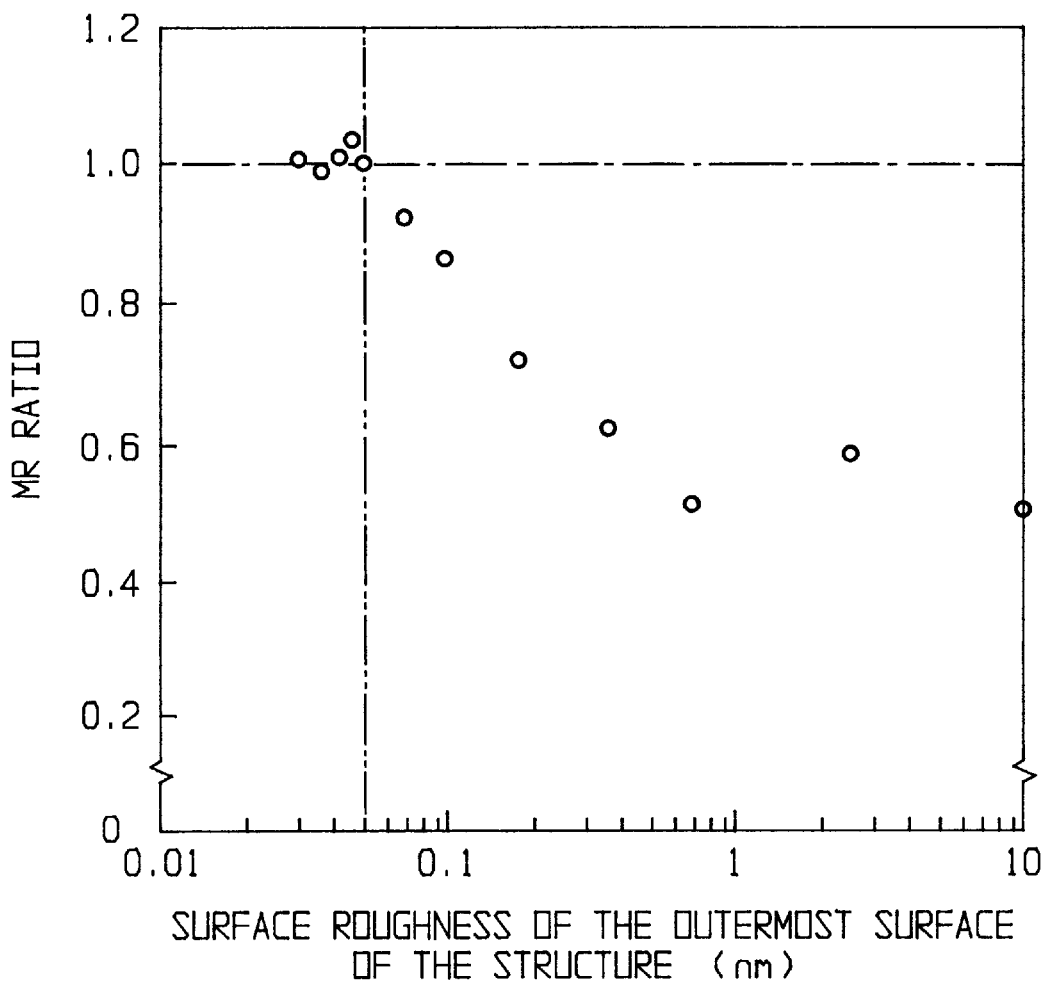
FIG. 11 is a graph showing the relationship between the surface roughness of the outermost surface of the structure of embodiment 8 and the MR ratio of the magnetoresistance element produced.
Figure 12:
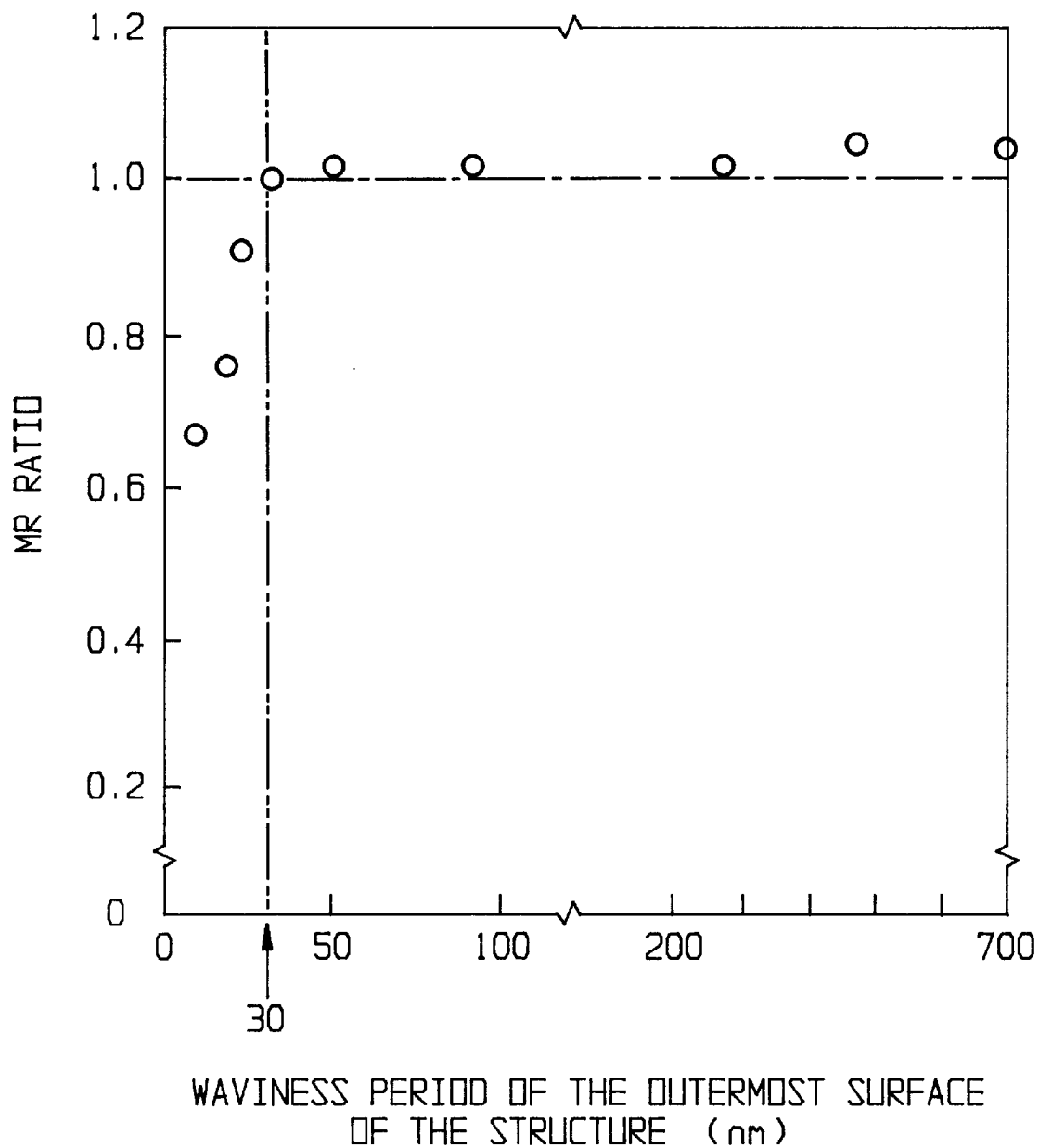
FIG. 12 is a graph showing the relationship between the waviness period of the outermost surface of the structure of embodiment 8 and the MR ratio of the magnetoresistance element produced.

FIG. 11 is a graph showing this dependency on the surface roughness of the outermost surface of the structure. FIG. 12 is a graph showing the dependency on the waviness period of the outermost surface of the structure. From FIG. 11, it can be seen that when Ra is greater than 0.5 nm, the MR ratio decreases. On the other hand, it can be seen from FIG. 12 that when the waviness period is smaller than 30 nm, the MR ratio decreases.

Accordingly, by setting the surface of the structure to a Ra of 0.5 nm or less and a waviness period of 30 nm or more, it was possible to produce a magnetoresistance element which stably possessed a high MR ratio.

Furthermore, this effect was independently confirmed with respect to magnetoresistance elements having the structure shown in embodiment 1.

Embodiment 9

In the present embodiment, an investigation was conducted into the effects of the cleaning of the surface of a substrate body by means of a high frequency sputtering method using Ar gas, prior to forming the structure on the substrate body, when a magnetoresistance element comprising an artificial lattice structure is produced using a sputtering method.

As in embodiment 1, a glass substrate (#7059) was used as a substrate body, while Ar gas having an impurity concentration of 10 ppb or less was employed.

The amount of surface removed from the substrate body by this cleaning was varied within a range of 0 to 5 nm, and magnetoresistance elements were formed, and the MR ratio thereof was measured.

Other points were identical to those of Embodiment 1.

Figure 13:
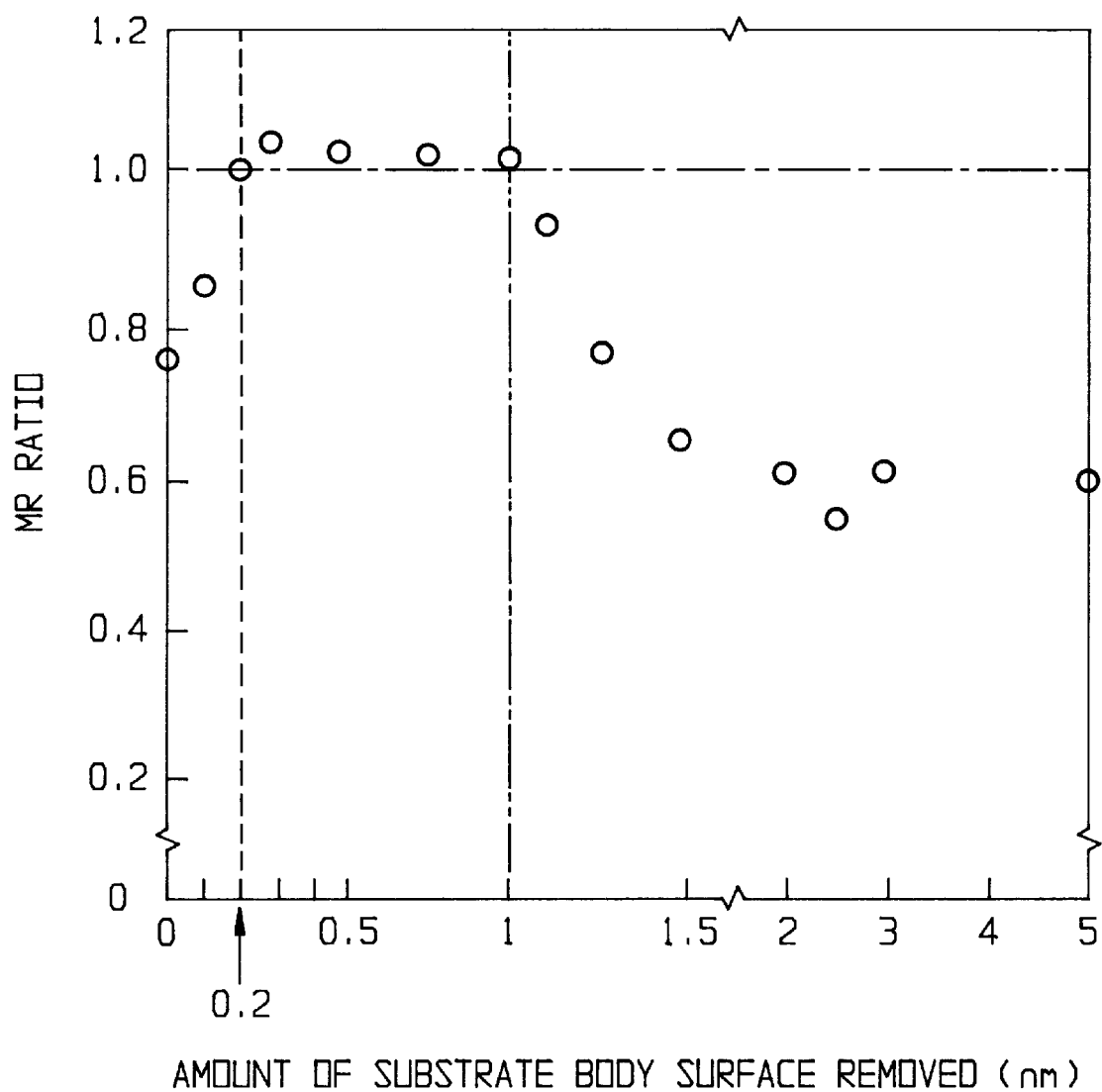
FIG. 13 is graph showing the relationship between the amount of substrate body surface removed of embodiment 9 and the MR ratio of the magnetoresistance element produced.
Figure 14:
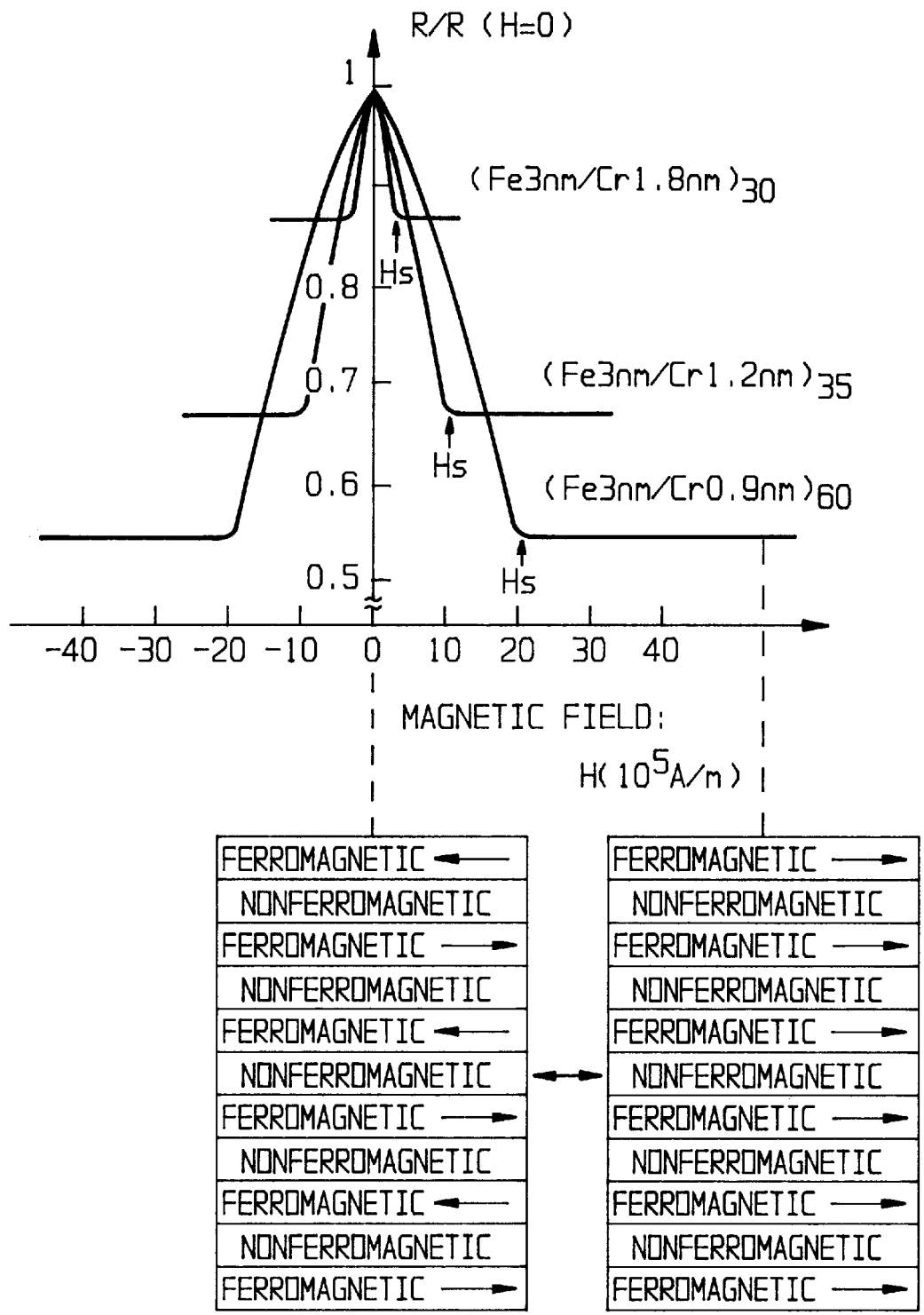
FIG. 14 is a graph showing an example of the results of an experiment with respect to the artificial lattice type using conventional technology.

FIG. 13 is a graph showing the results of the measurement of the MR ratio, with respect to the amount of substrate body surface removed.

From FIG. 13 it can be seen that when the amount of substrate body surface removed is within 0.2 nm to 1 nm, it is possible to stably obtain a high MR ratio.

Furthermore, this effect was independently confirmed in the case of magnetoresistance elements having the structure of Embodiment 2.

Embodiment 10

In the present embodiment, the effects were investigated of conducting cleaning of the surface of the substrate body by means of a high frequency sputtering method using Ar gas, prior to forming a structure on the substrate body, when a magnetoresistance element comprising an artificial lattice structure having Co as the ferromagnetic layers and Cu as the nonmagnetic layers was produced using a sputtering method.

The sample was produced on a Si (100) monocrystalline substrate at an Ar gas pressure within a range of 1 to 7 mTorr, using an opposed target type DC sputtering device having an attained vacuum degree of $5 \times 10^{-9}$ Torr or less.

The film structure was set so as to be Si/[Co(1.5 nm)/Cu (0.95 nm)]29/Co (1.5 nm)/Cu (3 nm). Prior to film formation, the substrate surface was subjected to dry etching with a Ar plasma produced by means of an RF power of 100 W and at an Ar gas pressure of 3 mTorr. At this time, the dry etching time $t_{DE}$ was varied within a range of 0 to 720 seconds. When the ferromagnetic layers and the nonmagnetic layers were formed and when the surface of the substrate was subjected to dry etching, the impurity concentration contained within the Ar gas was 10 ppb.

An analysis of the structure of the sample was conducted using X-ray diffraction, and V.S.M. was used for the magnetization curves. The magnetoresistance was measured at room temperature using a direct current four terminal method in which a magnetic field was applied in the direction of the surface of the film.

The other points were identical to those of embodiment 1.

Figure 15:
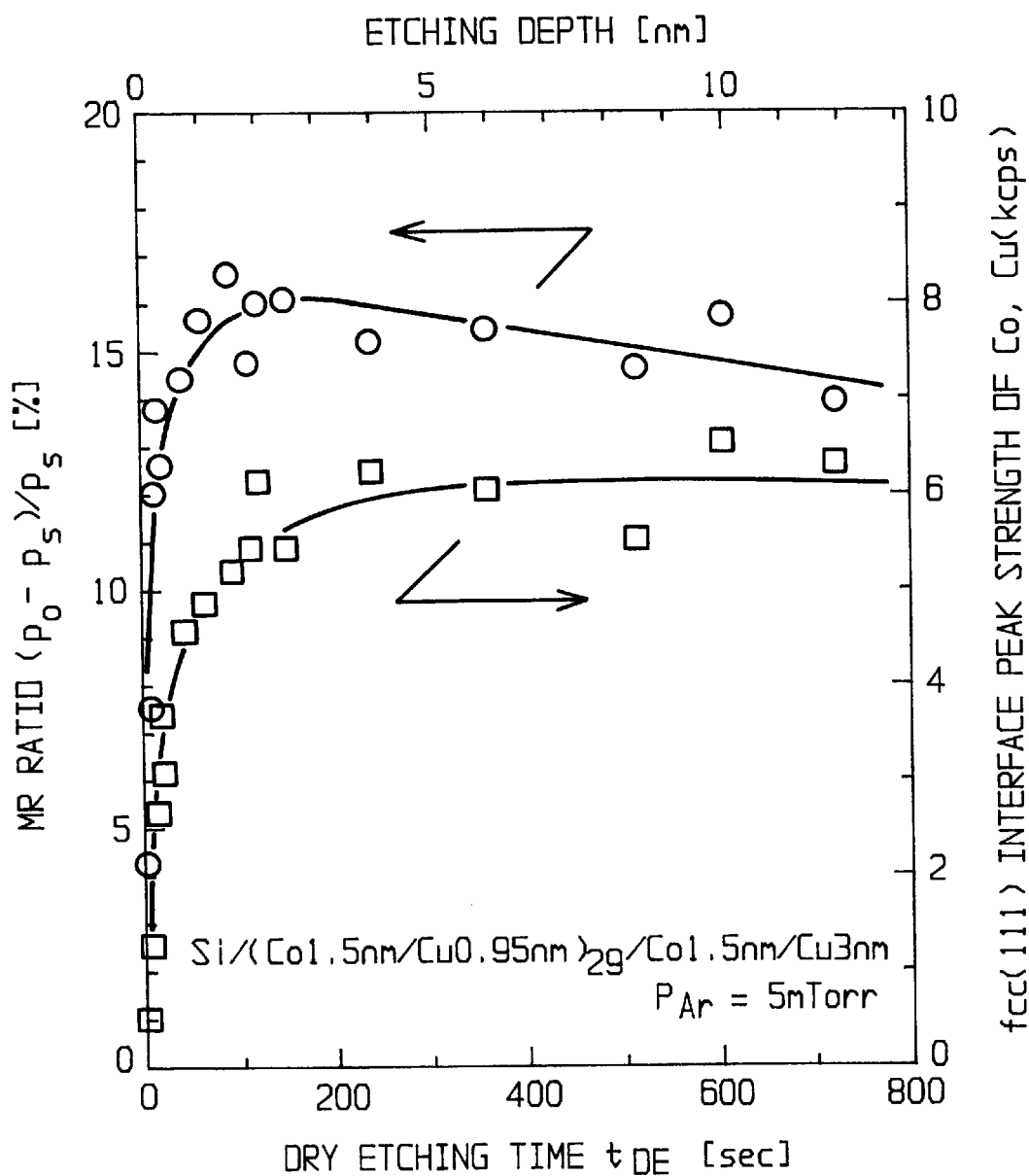
FIG. 15 is a graph showing the relationship between the MR ratio of a magnetoresistance element in accordance with embodiment 10 and the fcc (111) interference peak strength of Co and Cu, and the dry etching time $t_{DE}$.
Figure 16:
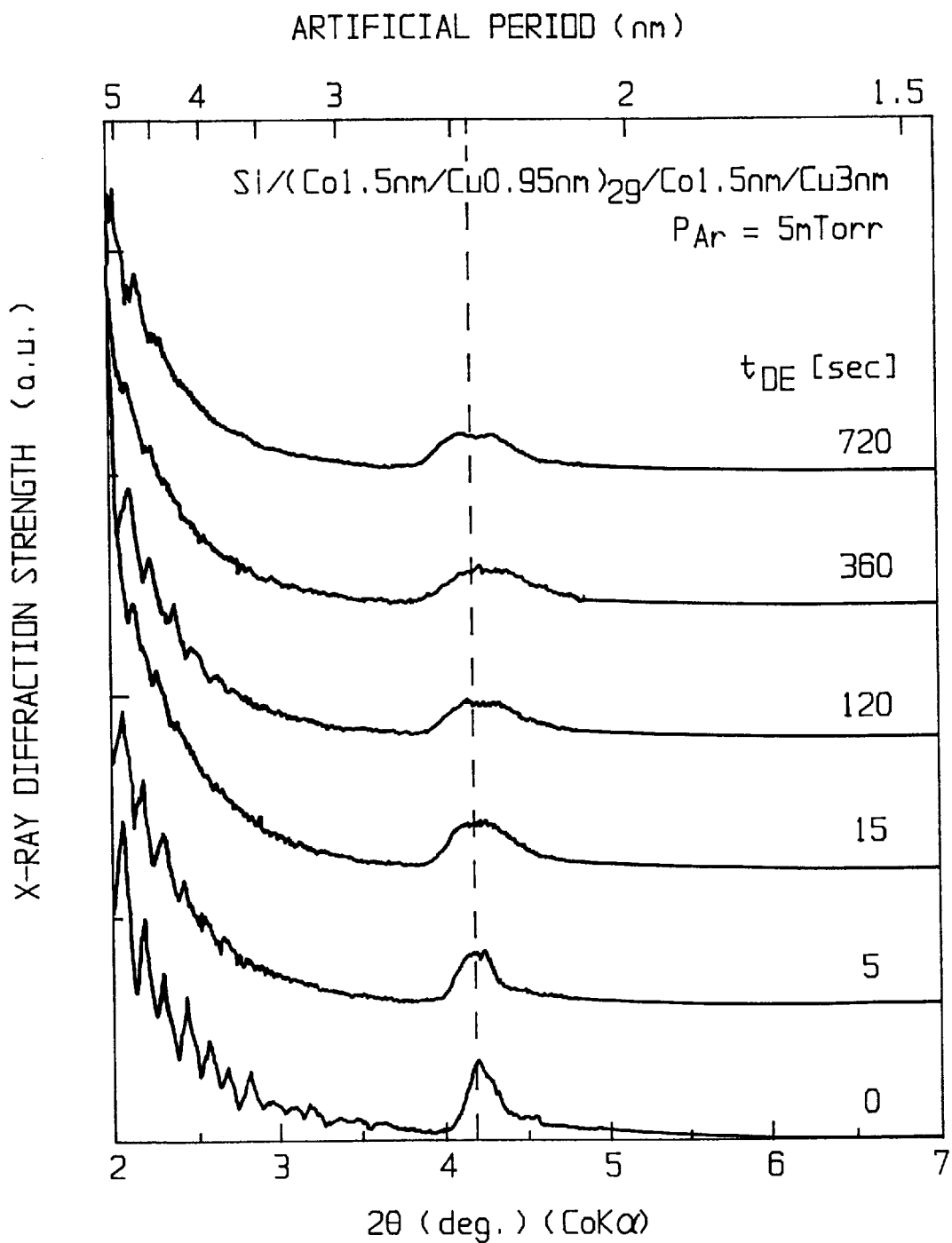
FIG. 16 is a graph showing the relationship between the small angle region X-ray diffraction profile of a magnetoresistance element in accordance with embodiment 10 and the dry etching time $t_{DE}$.

FIG. 15 is a graph showing the relationship between the MR ratio of the magnetoresistance elements produced and the Co and Cu fcc (111) interference peak strengths, and the dry etching time $t_{DE}$. The etching depth calculated from the amount etched from the Si substrate when $t_{DE}$ was 7200 seconds is also shown along the horizontal axis. FIG. 16 is a graph showing the relationship between the small angle region X-ray diffraction profile of the magnetoresistance element produced and the dry etching time $t_{DE}$.

The following points are clear from FIGS. 15 and 16.

(1) The MR ratio was small, at 4.2%, in the case in which a multi-layered film was produced without conducting dry etching; however, this increased markedly with an increase in $t_{DE}$, and reached a peak value roughly four times as great, at 16.6%, in the vicinity of 100 seconds.

(2) When $t_{DE}$ was greater than 100 seconds, there was, on the contrary, a tendency for the MR ratio to gradually decrease. The interference peak strength also showed changes similar to those of the MR ratio with respect to $t_{DE}$; this suggests that an increase in the crystalline nature of the multi-layered film produces an increase in the MR ratio.

(3) As a result of conducting dry etching, the diffraction peak reflecting the artificial period has a peak width which is broadened, and exhibits a tendency to separate into two peaks; this indicates that the artificial periodicity is declining.

From the above results, it is thought that the changes in the structure of the magnetoresistance elements produced are caused by the removal of adsorbed gases on the substrate surface and an increase in the crystal grain diameter of the multi-layered film to a point greater than that of the initial growth stage, which effects result from etching.

Embodiment 11

In the present embodiment, the effects were investigated of conducting cleaning of the surface of the substrate body by means of a high frequency sputtering method using Ar gas, prior to forming a structure provided with two ferromagnetic layers via an antiferromagnetic layer on a substrate body, in place of the spin valve type magnetoresistance element, the layered structure of which comprises a substrate body/ferromagnetic layer/nonmagnetic layer/ferromagnetic layer/antiferromagnetic layer.

The sample was produced on a Si (100) monocrystalline substrate by means of an opposed target type DC sputtering device. The attained vacuum degree was $2\times10^{-9}$ Torr. A leakage magnetic field of approximately 30 Oe was present at the surface of the substrate during film formation.

The film structure was set to a three layered structure of Si/first ferromagnetic layer Ni—Fe ($d_F$ nm)/antiferromagnetic layer Ni—Mn (100 nm)/second ferromagnetic layer Ni—Fe ($1.5 \times d_F$ nm), where the film thickness $d_F$ of the ferromagnetic layers was varied within a range of 5 to 20 nm. Immediately prior to film formation, dry etching of the substrate surface was conducted using RF sputtering. The sputtering time was varied, and the amount etched varied within a range of approximately 0 to 3 nm.

The structure of the sample was analyzed using X-ray diffraction, while V.S.M. was used for the magnetization curves. From the shift amount $H_{ex}$ of the center of the magnetization curve and the saturation magnetization $M_s$ of each NiFe layer, the unidirectional anisotropy constant $J_k$ operating at the ferromagnetic layer—antiferromagnetic layer interface was calculated ($=M_s \times H_{ex} \times$film thickness).

The other points were identical to those of embodiment 2.

Figure 17:
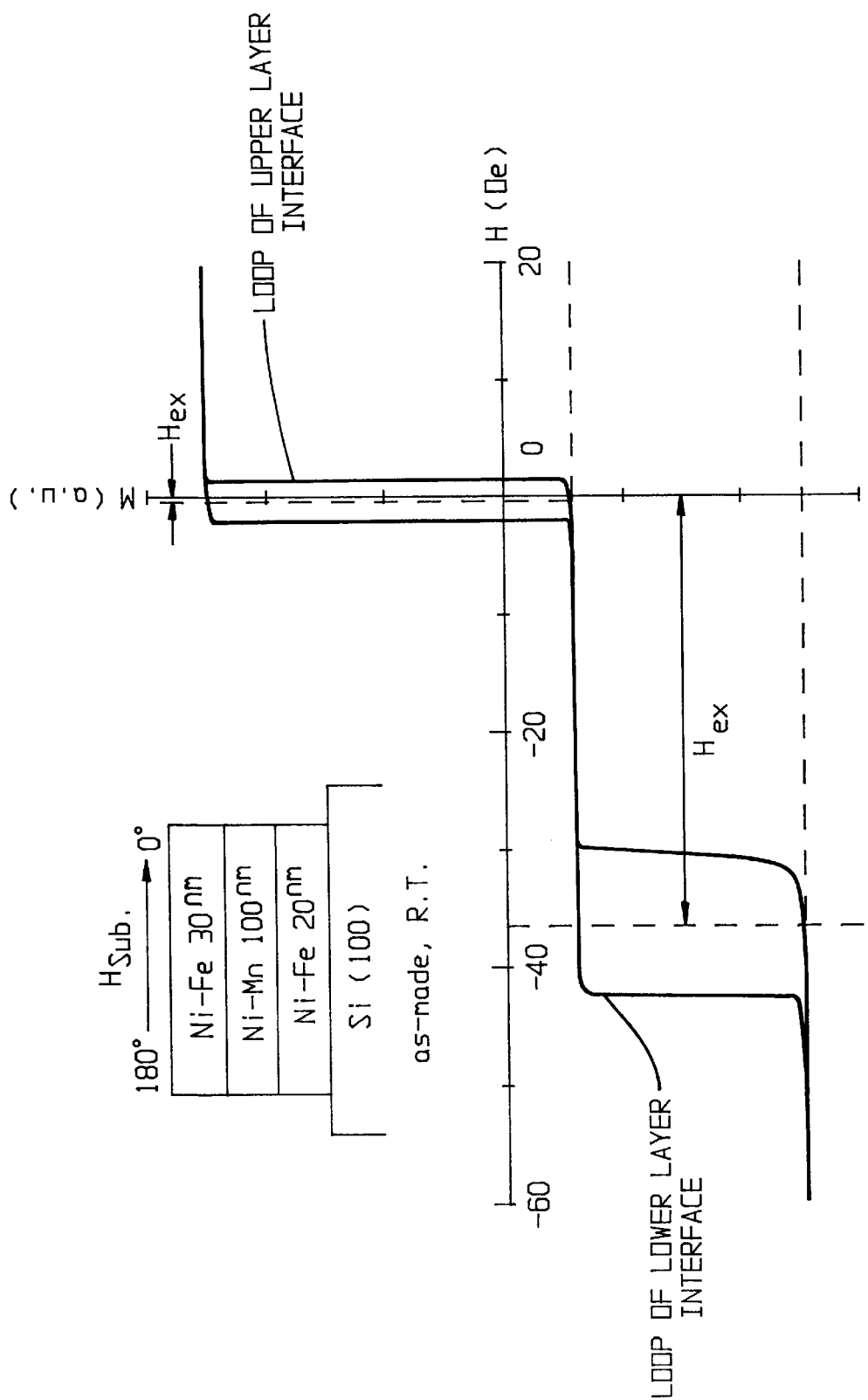
FIG. 17 is a graph showing the magnetization curve of a sample in accordance with embodiment 11.

FIG. 17 is a graph showing the magnetization curves of the sample produced. It can be seen from FIG. 17 that the lower layer interface (the interface between the first ferromagnetic layer and the antiferromagnetic layer) loop and the upper layer interface (the interface between the antiferromagnetic layer and the second ferromagnetic layer) loop are separate, and analysis is possible by loop.

Figure 18:
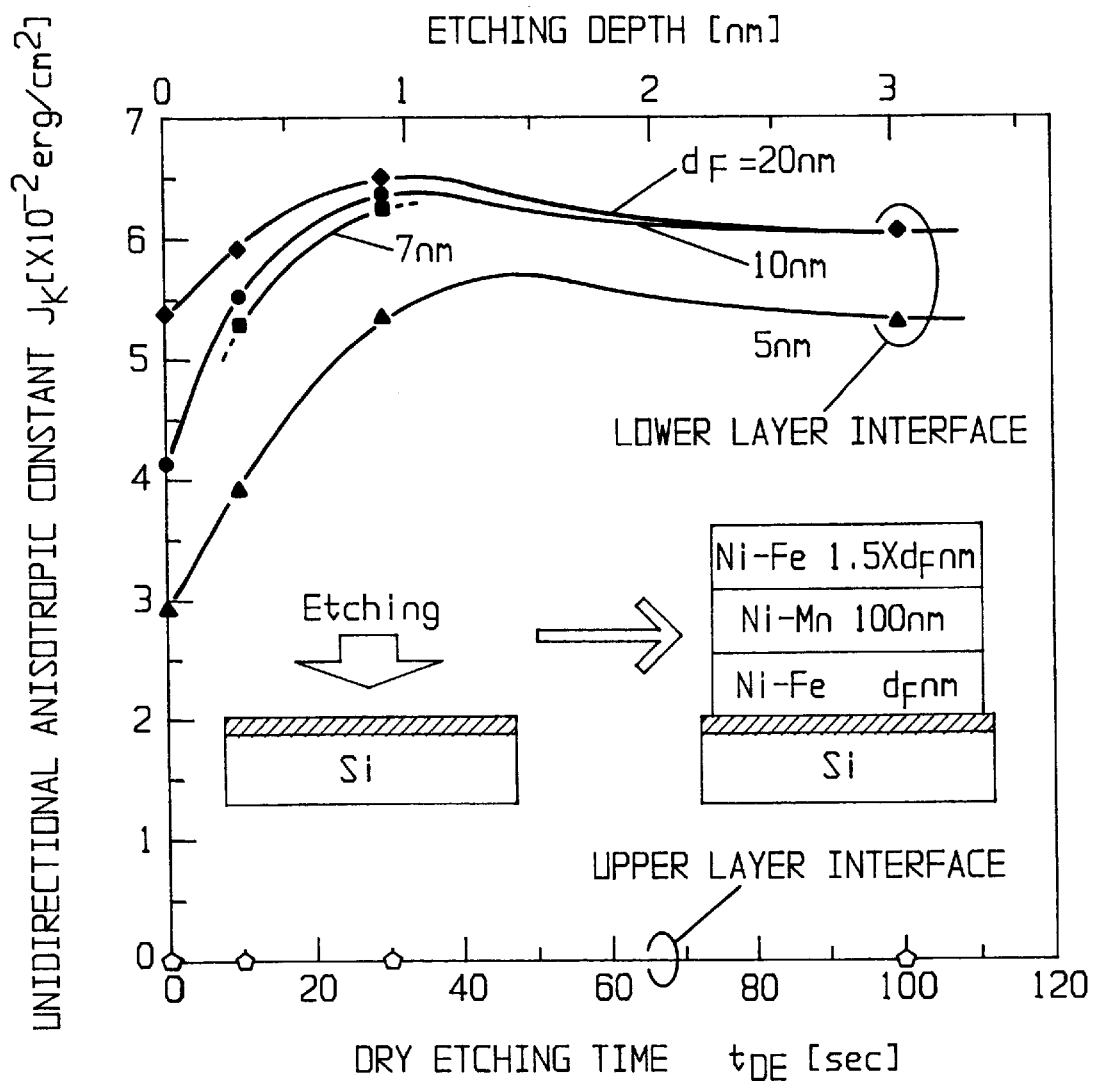
FIG. 18 is a graph showing the relationship between the unidirectional anisotropic constant $J_k$ of a sample in accordance with embodiment 11 and the dry etching time $t_{DE}$.
Figure 19:
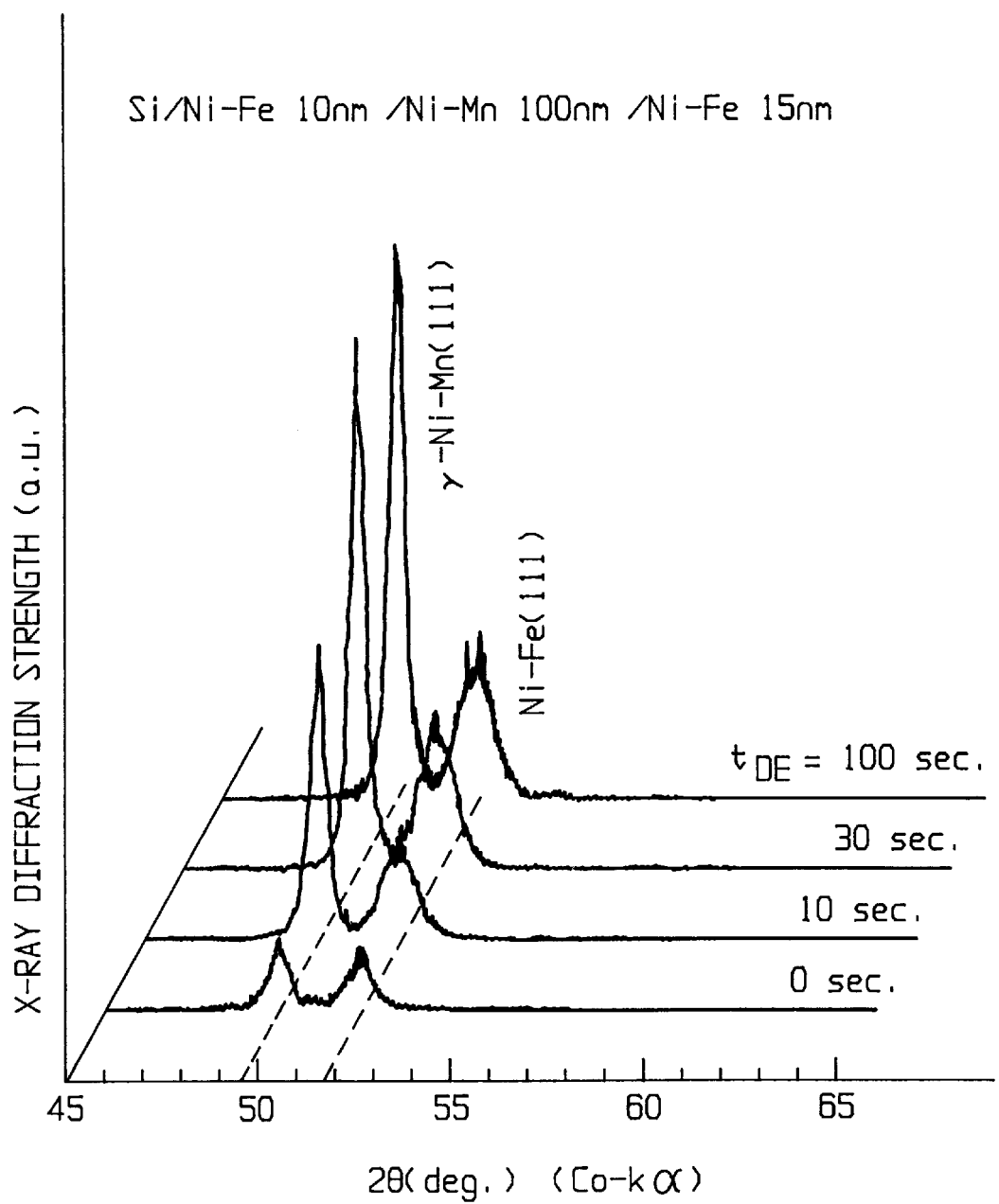
FIG. 19 is a graph showing the changes in the X-ray profile of a sample at $d_F=10$ nm when the dry etching time $t_{DE}$ is altered in accordance with embodiment 11.

FIG. 18 is a graph showing the relationship between the unidirectional anisotropy constant $J_k$ of the sample produced and the dry etching time $t_{DE}$. The etching depth as calculated from the etching amount of the Si substrate when $t_{DE}$=7200 seconds is also shown on the horizontal axis. FIG. 19 is a graph showing the change in the X-ray profile of a sample where $d_F$=10 nm, when $t_{DE}$ is altered.

The following points are clear from FIGS. 18 and 19.

(1) The value of $J_k$ at the lower layer interface was 0.03 erg/cm$^2$ when $d_F$ was 5 nm and dry etching was not conducted; however, this increases markedly in concert with an increase in $t_{DE}$ and exhibits a value approximately twice as large in the vicinity of a $t_{DE}$ of 30 seconds. As $t_{DE}$ increases further, $J_k$ begins to gradually decrease. Such a tendency was also observed when $d_F$ was altered.

(2) As $t_{DE}$ increases, the diffraction strength of the Ni—Fe (111) surface also increases, and it can be seen that there is an increase in the crystallization of the Ni—Fe layer. In concert with this, the diffraction strength of the γ—Ni—Fe (111) surface also increases, so that it is thought that the increase in $J_k$ in FIG. 16 is a result of the increase in crystallization of the Ni—Fe layer.

(3) The increase in the crystallization of the Ni—Fe layer at a $t_{DE}$ of up to 30 seconds is thought to occur because the adsorbed gases on the surface of the substrate are removed by the dry etching, and the increase in mobility of the Ni—Fe granules on the substrate, so that the crystalline grain diameter increases with respect to the stage of initial growth.

From the above results, it was determined that it is possible to increase the crystallinity of the ferromagnetic layer of the base layer which is initially formed on the substrate body by subjecting the surface of the substrate body to cleaning using a high frequency sputtering method, even in the case of spin valve type magnetoresistance elements comprising a substrate body/ferromagnetic layer/nonmagnetic layer/ferromagnetic layer/antiferromagnetic layer structure.

Embodiment 12

In the present embodiment, the points of difference with embodiment 11 are that after the formation of the first ferromagnetic layer, the surface of the first ferromagnetic layer is exposed to a prespecified degree of vacuum for a prespecified time.

Film formation was conducted using an opposed target type DC sputtering device having a load lock chamber.

During film formation, a leakage magnetic flux (30 Oe) was applied from the target to the surface of the substrate. A Si (100) monocrystalline substrate was employed as the substrate, and prior to film formation, dry etching of the substrate was conducted to approximately 0.3 nm.

The film structure was a three-layered structure comprising Si/first ferromagnetic layer Ni—Fe ($d_F$ nm)/antiferromagnetic layer Ni—Mn (20 nm)/second ferromagnetic layer Ni—Fe (1.5×$d_F$ nm), and two types of samples were produced, in which the film thickness $d_F$ of the ferromagnetic layer was 7 nm or 20 nm.

After the first ferromagnetic layer Ni—Fe was formed on the base layer, the sample was moved to a load lock chamber which is not depicted in the figure, and the surface of the first ferromagnetic layer Ni—Fe was exposed to a prespecified vacuum degree for a prespecified period of time. After exposure, the sample was returned to the film formation chamber, and an antiferromagnetic layer Ni—Mn and an upper second ferromagnetic layer Ni—Fe were formed in a continuous manner. The degree of vacuum of the load lock chamber was altered by controlling the amount of atmospheric leakage using a microflow valve.

The structure of the sample was analyzed using X-ray diffraction, and V.S.M. was employed for the magnetization curves. From the shift amount $H_{ex}$ of the center of the magnetization curve and the saturation magnetization $M_s$ of each Ni—Fe layer, the unidirectional anisotropic constant $J_k$ operating at the ferromagnetic layer/antiferromagnetic layer interface was calculated (=$M_s \times H_{ex} \times$film thickness)

The other points were identical to those in embodiment 11.

Figure 20:
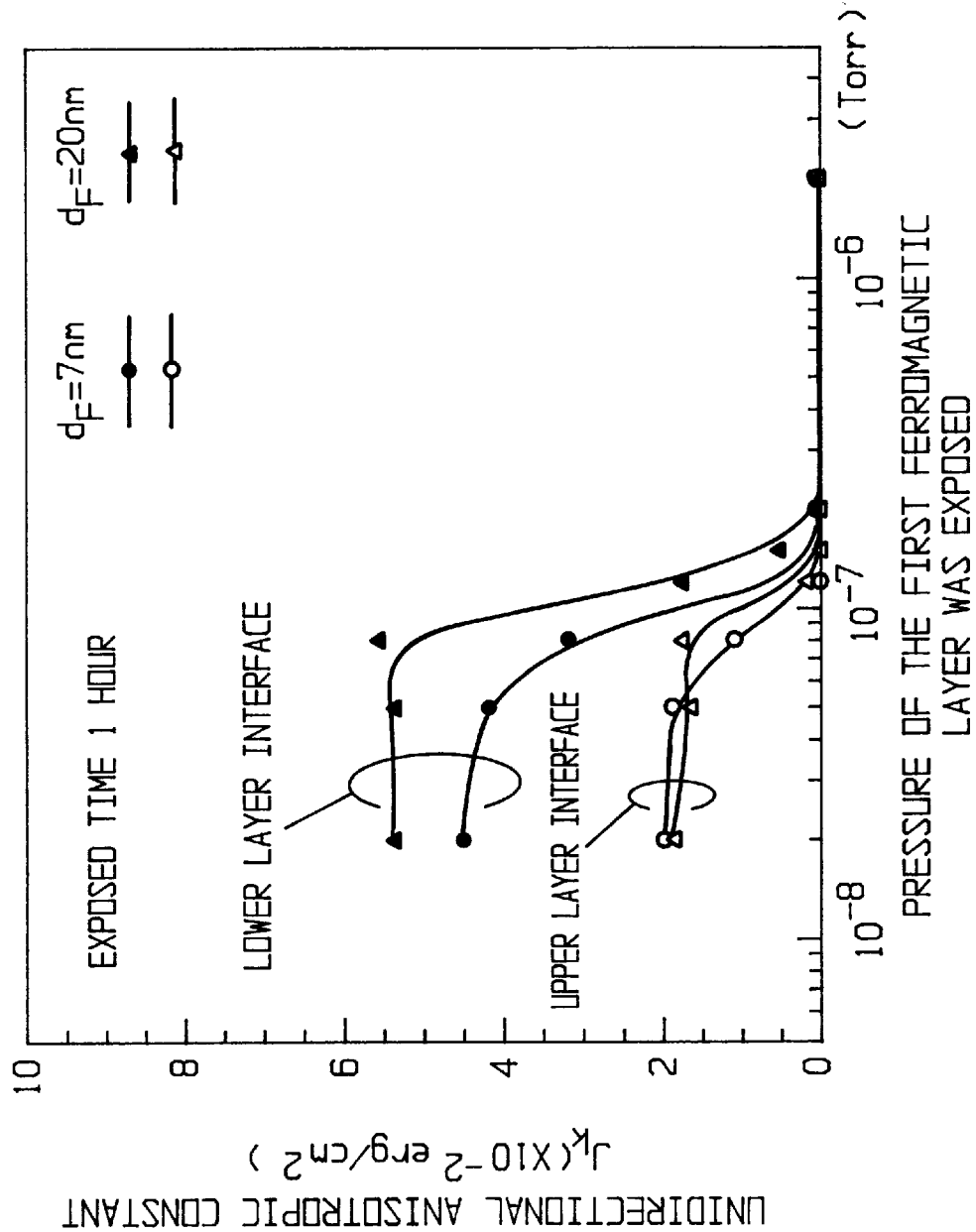
FIG. 20 is a graph showing the changes in the unidirectional anisotropic constant $J_k$ when the interface is exposed for a period of one hour in varying vacuum degrees in accordance with embodiment 12.
Figure 21:
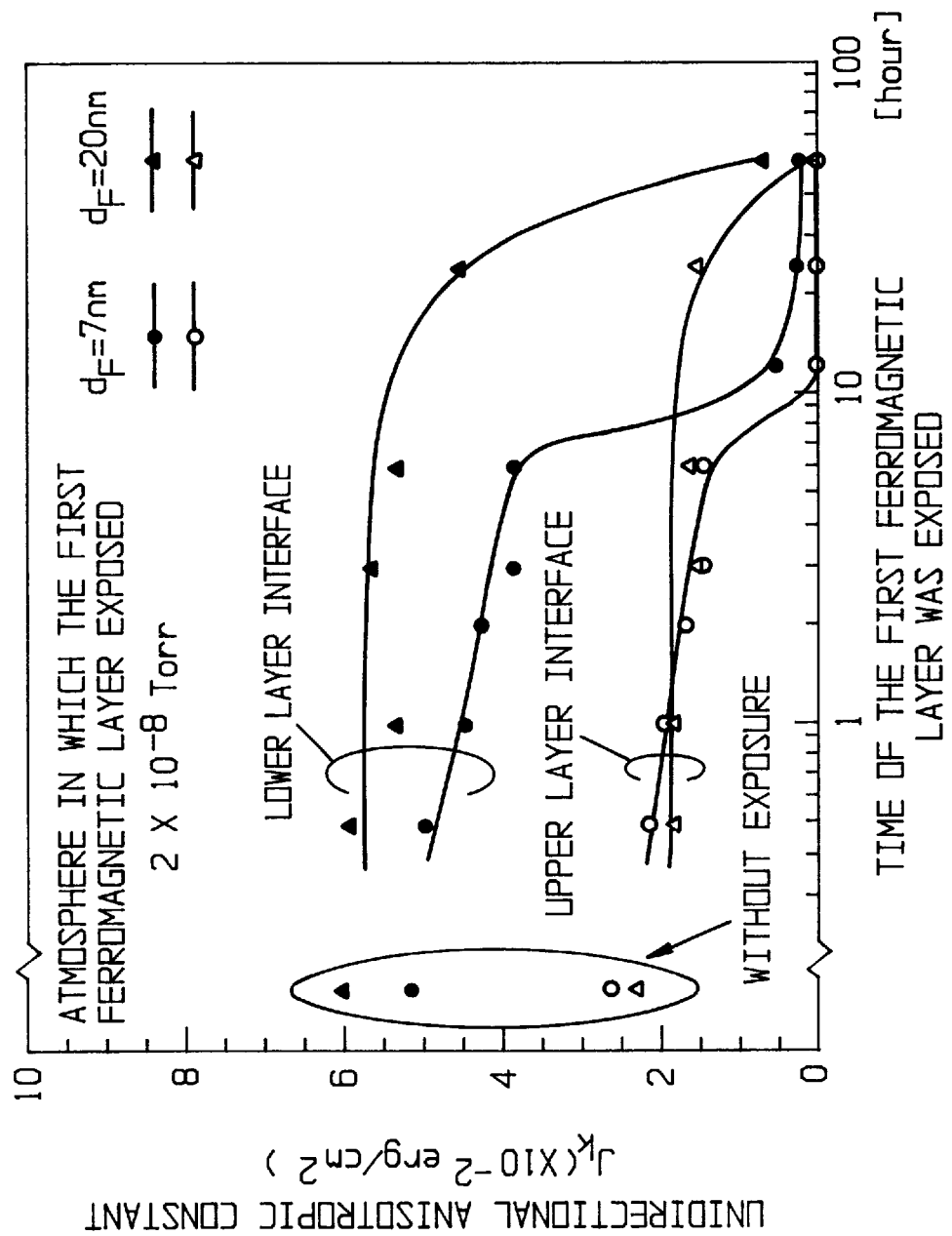
FIG. 21 is a graph showing the change in $J_k$ with respect to the time of exposure, when the interface is exposed to a constant vacuum degree ($2\times10^{-8}$ Torr) in accordance with embodiment 12.

FIG. 20 is a graph showing the change in the unidirectional anisotropy constant $J_k$ when the interface was exposed for a period of 1 hour to a variety of vacuum degrees. FIG. 21 is a graph showing the change in $J_k$ with respect to the exposure period when the interface was exposed to a constant degree of vacuum ($2 \times 10^{-8}$ Torr).

From FIGS. 20, 21 and the results of the X-ray diffraction, the following points are clear.

(1) It can be seen from FIG. 20 that $J_k$ decreases rapidly in the vicinity of an exposure atmosphere of $1 \times 10^{-7}$ Torr.

(2) It can be seen from FIG. 21 that $J_k$ decreases as the exposure period is lengthened. (3) From the results of the X-ray diffraction, it was confirmed that samples in which $J_k$ decreased had poor Ni—Mn crystallinity. It is assumed that the decrease in $J_k$ results from a decrease in the blocking temperature of the Ni—Mn grains in the interface resulting from a decrease in crystalline grain diameter.

Accordingly, the decrease in $J_k$ which results from exposure of the interface is thought to occur because the remaining gas such as moisture and the like present in the exposure atmosphere is adsorbed to the Ni—Fe surface, the mobility of the subsequent Ni—Mn sputtering grains on the Ni—Fe film decreases, and the Ni—Mn layer crystalline growth is hindered.

(4) When the differences resulting from the film thickness $d_F$ of the Ni—Fe layer are viewed, it can be seen that the case in which $d_F$=7 nm has a decreased exposure amount and a decreased $J_k$ with respect to the case in which =20 nm.

This is thought to occur because the size of the granules at the outermost surface of the Ni—Fe layer of the base layer are larger in the case in which d, is 20 nm than in the case in which $d_F$ is 7 nm. That is to say, with respect to the same amount of gas adsorption, the case in which the Ni—Fe granules comprising the base layer are larger permits a larger size of Fe—Mn particles.

By means of considering both the results of embodiment 12 described above (the results of an exposure of the interface between the first ferromagnetic layer and the antiferromagnetic layer) and the results of embodiment 11 (the results obtained by cleaning the surface of the substrate prior to the formation of the first ferromagnetic layer), it can be inferred that by means of forming the antiferromagnetic layer and the second ferromagnetic layer after cleaning the surface following exposure of the first ferromagnetic layer, it is possible to eliminate the effects of the exposure of the interface.

Embodiment 13

In the present embodiment, the points of difference from embodiment 11 are that the film thicknesses of the first ferromagnetic layer, the antiferromagnetic layer, and the second ferromagnetic layer were altered, and samples were formed by means of an opposed target type DC sputtering device so as to have a structure in which, on a Si (100) monocrystalline substrate, a Si/first ferromagnetic layer Ni—Fe ($d_F$ nm)/antiferromagnetic layer Ni—Mn ($d_{AF}$ nm)/second ferromagnetic layer Ni—Fe (1.5×$d_F$ nm) structure was formed. The film thickness $d_F$ of the ferromagnetic layers, and the film thickness $d_{AF}$ of the antiferromagnetic layer, were varied within a range of 5 to 100 nm. A leakage magnetic field of approximately 30 Oe was present at the substrate surface during film formation. Prior to film formation, dry etching of the substrate surface was not conducted.

The structure of the sample was analyzed using X-ray diffraction, while V.S.M. and a SQUID fluxmeter were employed for the magnetization curves. From the shift amount $H_{ex}$ of the center of the magnetization curve and the saturation magnetization $M_s$ of each Ni—Fe layer, the unidirectional anisotropic constant $J_k$ operating at the ferromagnetic layer/antiferromagnetic layer interface was calculated (=$M_s \times H_{ex} \times$film thickness). The measurement was carried out at room temperature.

The other points are identical to those of embodiment 11.

Figure 22:
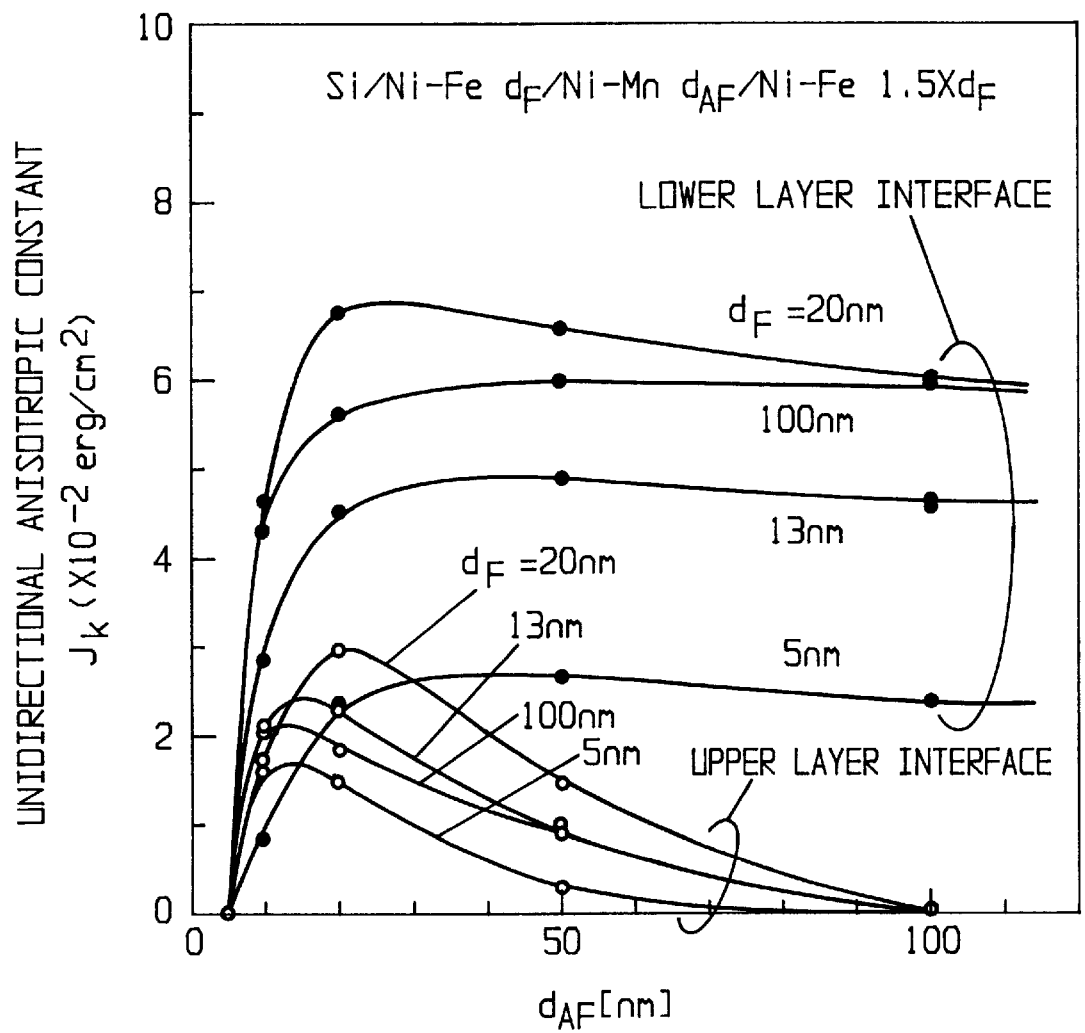
FIG. 22 is a graph showing $J_k$ in the three-layer film of various layered structures in accordance with the thirteenth embodiment, as a function of the thickness $d_{AF}$ of the antiferromagnetic layer.
Figure 23:
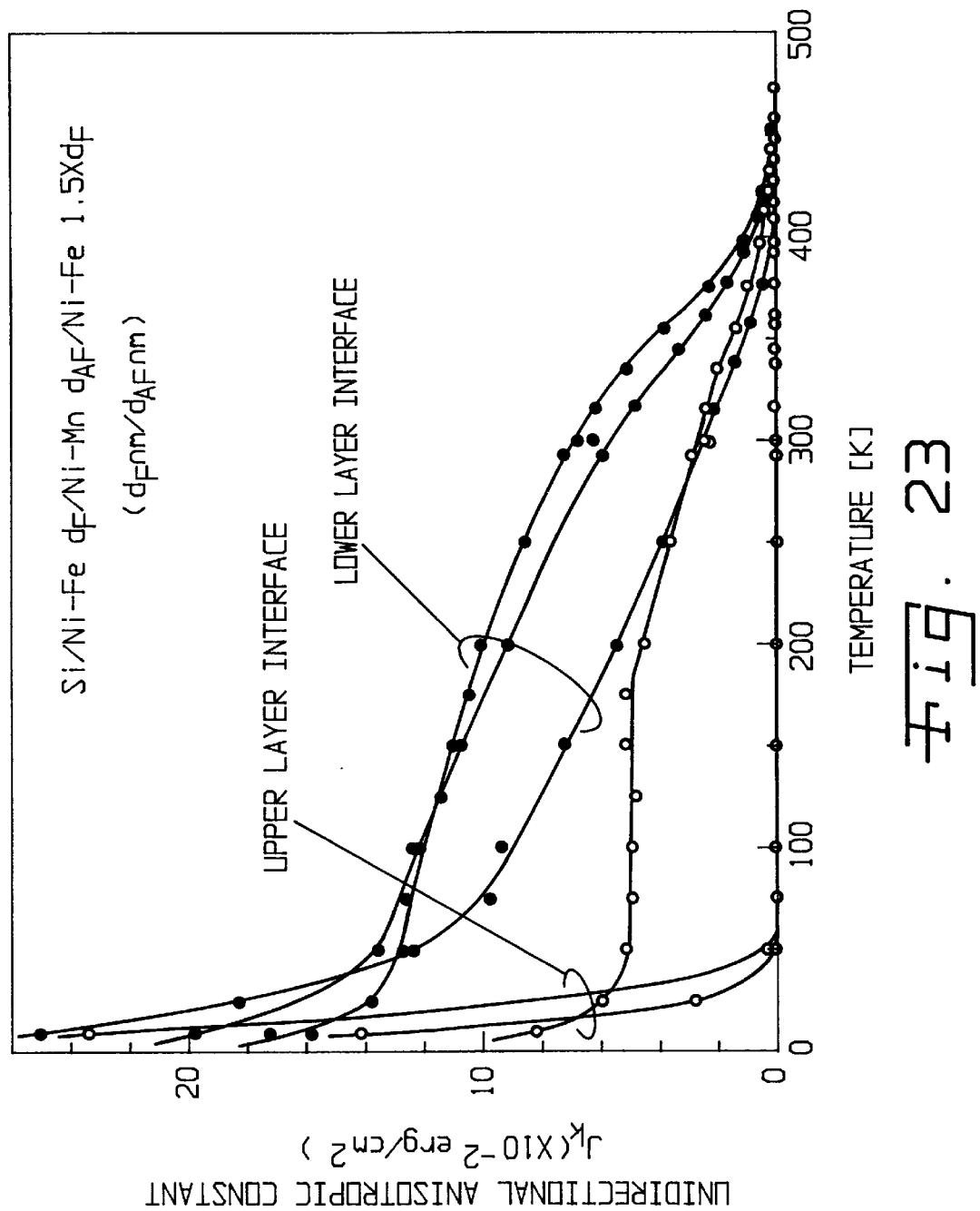
FIG. 23 is a graph showing the temperature dependence of $J_k$ in three-layered films having various structures.

FIG. 22 is a graph showing $J_k$ within the three-layered film of the various film structures as a function of the film thickness $d_{AF}$ of the antiferromagnetic layer. FIG. 23 is a graph showing the dependence on temperature of $J_k$ in the three-layered film of a variety of film structures. When temperatures rose and fell, a magnetic field of 1 kOe was applied in the direction (the 0° direction) of the unidirectional anisotropy induced in the film immediately after film formation. In FIGS. 22 and 23, the $J_k$ in accordance with the lower layer interface (the interface between the first ferromagnetic layer and the antiferromagnetic layer) and the $J_k$ in accordance with the upper layer interface (the interface between the antiferromagnetic layer and the second ferromagnetic layer) are both shown.

The following points are clear from the results of FIG. 22 and the X-ray diffraction.

(1) With respect to the change in $J_k$ in the lower level interface, looking at the case in which $d_F$=5 nm, when $d_{AF}$=5 nm, $J_k$ has a value of 0, and in concert with the increase in $d_{AF}$, this increases rapidly to approximately 20 nm, and after this, exhibits a broad peak, and then tends to approach a fixed value.

(2) The tendency of (1) above was also observed in the case in which $d_F$ was increased; $J_k$ increased until $d_F$ was approximately 20 nm, and at a higher value of $d_F$ (=100 nm), $J_k$ was seen to decrease slightly.

(3) From the X-ray diffraction results, an increase in the diffraction peak strength from γ—Ni—Mn was observed in concert with the increase in $d_F$ and $d_{AF}$, and the increase in $J_k$ is thought to result in an increase in Ni—Mn crystallinity (an increase in the crystalline grain diameter).

From the results of FIG. 23, the following points are clear.

(4) In all films, at approximately 440 K or more, $J_k$ had a value of 0; however, in concert with a decrease in temperature (cooling within a magnetic field), the $J_k$ at the lower layer interface slowly increased, and at a temperature of approximately 50 K or less, this increased rapidly. This increase in $J_k$ at temperatures of 50 K or below is thought to result from the α phase Ni—Mn particles within the interface.

(5) On the other hand, the proportion of the increase in $J_k$ between room temperature and 50 K differs depending on the film structure, so that it is larger in films in which ($d_F$ nm/$d_{AF}$ nm)=(5/100) than in films in which these values are (20/100).

By considering the results of FIG. 22 and the results of FIG. 23 together, it can be inferred that the γ phase Ni—Nm particles having a small crystalline grain diameter experience a decrease in blocking temperature as a result of thermal agitation, and thus at room temperature, cause the value $J_k$ to decrease.

INDUSTRIAL APPLICABILITY

As described above, in accordance with the present invention, the structure comprising a MR element, whether of an artificial lattice type or a spin valve type, permits the realization of a high MR ratio, and thus it is possible to obtain magnetoresistance elements which are applicable to MR heads or the like which may be used in increasing recording density.

Furthermore, in accordance with the present invention, a manufacturing method is obtained for such magnetoresistance elements which makes it possible to stably produce the magnetoresistance elements having a high MR ratio which are described above.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A magnetoresistance element comprising:
   a substrate body having a surface; and
   a plurality of ferromagnetic layers sandwiching nonmagnetic layers laminated on said surface of said substrate body, in which the oxygen concentration contained in said layers is 100 wt. ppm. or less.

2. A magnetoresistance element comprising:
   a substrate body having a surface;
   a structure having ferromagnetic layers sandwiching a nonmagnetic layer laminated on said surface of said substrate body; and
   an antiferromagnetic layer formed on the surface of a said ferromagnetic layer which is provided last, in which the oxygen concentration contained in the portion in which the ferromagnetic layers sandwich the nonmagnetic layer is 100 wt. ppm. or less.

3. A ferromagnetic layer in accordance with claim 1 in which the ferromagnetic layers include monolayer films comprising one or more elements selected from the group consisting of Co, Fe, and Ni.

4. A ferromagnetic layer in accordance with claim 1 in which said ferromagnetic layer includes laminated films comprising differing monolayer films or alloy films.

5. A magnetoresistance element in accordance with claim 1 in which said nonmagnetic layer includes a nonmagnetic element comprising an element selected from the group consisting of Cu, Mo, and Nb.

6. A magnetoresistance element in accordance with claim 1 in which said nonmagnetic layer comprises a monolayer film comprising one element selected from the group consisting of Cu, Ag, Pd, Au, and Pt.

7. A magnetoresistance element in accordance with claim 1 in which the antiferromagnetic layer comprises an alloy film comprising one element selected from the group consisting of Co, Fe, Ne, and Pd, and one element selected from the group consisting of Mn and O.

8. A magnetoresistance element in accordance with claim 1 in which said substrate body comprises one of a nonmagnetic substrate, and a nonmagnetic substrate, said surface of which is covered with a base layer.

9. A magnetoresistance element in accordance with claim 2 in which a protective layer is provided on the outermost surface of said structure.

10. A magnetoresistance element in accordance with claim 9 in which said substrate body is covered by a base layer, said base layer and protective layer comprise monolayer films comprising one of an element selected from the group consisting of Cu, Ta, W, Ti, and Cr, and a laminated film comprising differing monolayer films.

11. A magnetoresistance element in accordance with claim 1 in which the surface of the substrate body is such that Ra is 0.1 nm or less, and the waviness period is 100 nm or more.

12. A magnetoresistance element in accordance with claim 2 in which the outermost surface of said structure is such that Ra is 0.5 nm or less, and the waviness period is 30 nm or more.

13. A manufacturing method for a magnetoresistance element in accordance with claim 1 comprising the steps of:
   setting back pressure of a film formation chamber to $10^{-9}$ Torr or less; then
   forming the nonmagnetic layers, ferromagnetic layers, and antiferromagnetic layer of the magnetoresistance element by a sputtering method using Ar having an impurity concentration of 10 ppb or less as the film formation gas.

14. A manufacturing method for a magnetoresistance element in accordance with claim 13, including the step of cleaning the surface of the substrate body by a high frequency sputtering method using Ar gas having an impurity concentration of 10 ppb or less; and
   removing an amount within a range of 0.2 nm to 1 nm from the surface of the substrate body before forming said element.

* * * * *